US009619327B2

(12) United States Patent
Ha et al.

(10) Patent No.: US 9,619,327 B2
(45) Date of Patent: Apr. 11, 2017

(54) FLASH MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Jeong-Seok Ha, Daejeon (KR); Dae-Sung Kim, Daejeon (KR)

(73) Assignees: SK Hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/945,623

(22) Filed: Nov. 19, 2015

(65) Prior Publication Data

US 2017/0004036 A1   Jan. 5, 2017

(30) Foreign Application Priority Data

Jun. 30, 2015  (KR) .................. 10-2015-0092584

(51) Int. Cl.
  *H03M 13/00* (2006.01)
  *G06F 11/10* (2006.01)
  *G11C 29/52* (2006.01)
  *H03M 13/15* (2006.01)

(52) U.S. Cl.
  CPC .......... *G06F 11/1068* (2013.01); *G11C 29/52* (2013.01); *H03M 13/1545* (2013.01); *H03M 13/1575* (2013.01)

(58) Field of Classification Search
  CPC ............. H03M 13/152; H03M 13/157; H03M 13/158; H03M 13/15; H03M 13/1515; H03M 13/151
  See application file for complete search history.

(56) References Cited

U.S. PATENT DOCUMENTS

| 5,416,786 A | 5/1995 | Lin et al. | |
|---|---|---|---|
| 7,725,800 B2* | 5/2010 | Yang | G11B 20/1833 714/755 |
| 2004/0177312 A1* | 9/2004 | Xin | H03M 13/15 714/782 |
| 2010/0174970 A1* | 7/2010 | Goldberg | H03M 13/152 714/785 |
| 2012/0173951 A1* | 7/2012 | Kong | H03M 13/1515 714/755 |

FOREIGN PATENT DOCUMENTS

KR    1020140074600    6/2014

* cited by examiner

*Primary Examiner* — David Ton
(74) *Attorney, Agent, or Firm* — IP & T Group LLP

(57) ABSTRACT

An operation method of a flash memory system includes: obtaining first syndrome values to a codeword; obtaining locations of errors and the number of the locations of errors based on the first syndrome values; error-correcting the codeword by flipping bit values of error bits of the codeword based on the locations of errors to generate an error-corrected codeword; obtaining second syndrome values to the error-corrected codeword; determining whether an error is found in the error-corrected codeword based on the second syndrome values; changing the first syndrome values when it is determined that no error is found in the error-corrected codeword; and restoring the error-corrected codeword to the codeword by re-flipping the flipped bit values when it is determined that an error is found in the error-corrected codeword.

21 Claims, 22 Drawing Sheets

Parallel Concatenation

Serial Concatenation

FLASH MEMORY SYSTEM AND OPERATING METHOD THEREOF

CROSS-REFERENCE TO RELATED APPLICATIONS

The present application claims priority to Korean Patent Application No. 10-2015-0092584, filed on Jun. 30, 2015, which is herein incorporated by reference in its entirety.

BACKGROUND

1. Field

Various exemplary embodiments of the present invention relate to a flash memory system and, more particularly, to a flash memory system performing error correction with an error correction code and an operation method thereof.

2. Description of the Related Art

Currently, solid state drives (SSD) preferably use multi-level cell (MLC) flash memory capable of storing multi-bits in a single cell and are thus capable of reducing a production cost per bit. However, when compared with single level cell (SLC) flash memory, the MLC has unstable data security and high error bit probability due to a reduced noise margin among the data stored in memory cell. The Bose-Chadhuri-Hocquenghem (BCH) code, the Reed-Solomon (RS) code, and the hamming code are widely used for detecting and correcting a plurality of error bits.

FIG. 1 is a block diagram illustrating the BCH code decoder. Referring to FIG. 1, an error correction code decoder or the BCH code decoder uses the BCH code. The BCH code has a characteristic guaranteeing error correction of the error bits for as many as the maximum error correction capability "t." Due to this characteristic, the BCH code is widely used in the SSD as the next generation storage medium. As a number of bits stored in a single MLC increases, the error bit probability increases. Thus, the BCH code is required to have greater error correction capability.

The error correction code decoder includes a syndrome calculation block 11, a key-equation solver block 13, a chien search block 15, and an error correction block 17.

The syndrome calculation block 11 generates syndrome values based on a received codeword. When all of the syndrome values are '0', or the received codeword does not have any error, the codeword is outputted as is without error correction.

However, when one or more of the syndrome values are not '0', the key-equation solver block 13, which uses the Berleykamp-Massey (BM) algorithm or the Euclidian algorithm, generates the error location polynomial (ELP) based on the syndrome values in order to solve the key-equation.

The chien search block 15 calculates locations of errors through the ELP generated by the key-equation solver block 13. The chien search block 15 obtains the locations of errors and the number of the locations of errors by applying Galois Field (GF) elements to the ELP, which is a high-degree equation, determining whether or not the GF elements satisfy the ELP, and finding roots of the ELP.

The error correction block 17 determines whether or not the number of the locations of errors obtained through the Chien search algorithm corresponds to the degree of the ELP, and error-corrects the error bits. In another embodiment, the error correction block 17 ignores failure of the error correction, error-corrects the error bits by flipping all of bit values corresponding to the locations of errors obtained by the chien search block 15, and provides the error-corrected codeword to the host.

When the number of the locations of errors of the received code word is beyond the maximum error correction capability "t" of the BCH code decoder, the key-equation solver block 13 and the chien search block 15 cannot error-correct the errors of the codeword and generate more errors in the codeword. That is, the bit-flip of the values of error bits in the codeword leads to more errors due to erroneous operations of the key-equation solver block 13 and the chien search block 15, and causes incorrect error-decoding with the BCH code at the next stage.

SUMMARY

In accordance with an embodiment of the present invention, an operation method of a flash memory system including a controller, a memory device, and a host, may include: obtaining first syndrome values by performing a first syndrome operation to a codeword provided from the memory device; obtaining locations of errors and the number of the locations of errors, which are included in codeword, based on the first syndrome values; error-correcting the codeword by flipping bit values of error bits of the codeword based on the locations of errors to generate an error-corrected codeword; obtaining second syndrome values by performing a second syndrome operation to the error-corrected codeword; determining whether an error is found in the error-corrected codeword based on the second syndrome values; changing the first syndrome values when it is determined that no error is found in the error-corrected codeword and providing the error-corrected codeword and a success flag to the host; and restoring the error-corrected codeword to the codeword by re-flipping the flipped bit values when it is determined that an error is found in the error-corrected codeword and providing the restored codeword to the host.

The operation method of a flash memory system may store the first syndrome values in a first syndrome buffer, and store the second syndrome values in a second syndrome buffer. The obtaining of the locations of errors and the number of the locations of errors may include: generating an error location polynomial based on the first syndrome values; and obtaining the locations of errors and the number of the locations of errors based on the error location polynomial. The error location polynomial may be generated using the Berleykamp-Massey algorithm or the Euclidian algorithm. The locations of errors and the number of the locations of errors may be obtained on the basis of the error location polynomial using the Chien search algorithm. The changing of the first syndrome values may be performed by changing a value of '1' in the first syndrome values to a value '0', or by replacing the first syndrome values with the second syndrome values.

In accordance with an embodiment of the present invention, an operation method of a flash memory system including a controller, a memory device, and a host, may include: obtaining first syndrome values by performing a first syndrome operation to a codeword provided from the memory device; generating an error location polynomial based on the first syndrome values; obtaining locations of errors and a number of the locations of errors, which is included in the codeword, based on the error location polynomial; determining whether or not a degree of the error location polynomial is the same as the number of locations of errors; error-correcting the codeword by flipping bit values of error bits of the codeword based on the locations of errors to generate an error-corrected codeword when the degree of the error location polynomial is the same as the number of locations of errors; obtaining second syndrome values by performing a second syndrome operation to the error-corrected codeword; determining whether an error is found in the error-corrected codeword based on the second syndrome values; changing the first syndrome values when it is determined that no error is found in the error-corrected codeword and providing the error-corrected codeword and a success flag to the host; restoring the error-corrected codeword to the codeword by re-flipping the flipped bit values when it is determined that the error-corrected codeword includes one or more errors and providing the restored codeword and a failure flag to the host.

An operation method of a flash memory system may store the first syndrome values in a first syndrome buffer, and store the second syndrome values in a second syndrome buffer. An operation method of a flash memory system may provide the codeword and a failure flag to the host, when the degree of the error location polynomial may be not the same as the number of locations of errors. The changing of the first syndrome values may be performed by changing a value of '1' in the first syndrome values to a value '0', or by replacing the first syndrome values with the second syndrome values. The error location polynomial may be generated using the Berleykamp-Massey algorithm or the Euclidian algorithm, and the locations of errors and the number of the locations of errors may be obtained on the basis of the error location polynomial using the Chien search algorithm.

In accordance with an embodiment of the present invention, an operation method of a flash memory system including a controller, a memory device, and a host, may include: obtaining first syndrome values by performing a first syndrome operation to a codeword provided from the memory device; obtaining locations of errors and a number of the locations of errors, which is included in codeword, based on the first syndrome values; error-correcting the codeword by flipping bit values of error bits of the codeword based on the locations of errors to obtain an error-corrected codeword; obtaining second syndrome values by performing a second syndrome operation to the error-corrected codeword; determining whether an error is found in the error-corrected codeword based on the second syndrome values; providing the error-corrected codeword and a success flag to the host when it is determined that no error is found in the error-corrected codeword, restoring the error-corrected codeword to the codeword by re-flipping the flipped bit values of the error-corrected codeword when it is determined that an error is found in the error-corrected codeword to generate a restored codeword; obtaining third syndrome values by performing a third syndrome operation to the restored codeword; and providing the restored codeword and a failure flag to the host; storing the first syndrome values in a syndrome buffer; storing the second syndrome values in the syndrome buffer; and storing the third syndrome values the syndrome buffer. The obtaining of the locations of errors and the number of the locations of errors may include: generating an error location polynomial based on the first syndrome values; and obtaining the locations of errors and the number of the locations of errors based on the error location polynomial. The error location polynomial may be generated using the Berleykamp-Massey algorithm or the Euclidian algorithm, and the locations of errors and the number of the locations of errors may be obtained on the basis of the error location polynomial using the Chien search algorithm.

In accordance with an embodiment of the present invention, an operation method of a flash memory system including a controller, a memory device, and a host, may include: obtaining first syndrome values by performing a first syndrome operation to a codeword provided from the memory device; obtaining locations of errors and a number of the locations of errors, which are included in the codeword, based on the first syndrome values; obtaining second syndrome values by performing a second syndrome operation to the codeword; determining whether or not the codeword is error-correctable based on the second syndrome values; error-correcting the codeword by flipping bit values of error bits of the codeword based on the locations of errors when it is determined that the codeword is error-correctable to generate an error-corrected codeword and providing the error-corrected codeword and a success flag to the host; An operation method of a flash memory system may provide the codeword and a failure flag to the host when it is determined that the codeword is not error-correctable. An operation method of a flash memory system may store the first syndrome values to a first syndrome buffer and store the second syndrome values to a second syndrome buffer, changing a value of '1' in the first syndrome values to a value '0', or by replacing the first syndrome values with the second syndrome values, after the error-correcting of the codeword. The obtaining of the locations of errors and the number of the locations of errors may include: generating an error location polynomial based on the first syndrome values; and obtaining the locations of errors and the number of the locations of errors based on the error location polynomial. The error location polynomial may be generated using the Berleykamp-Massey algorithm or the Euclidian algorithm, and the locations of errors and the number of the locations of errors may be obtained on the basis of the error location polynomial using the Chien search algorithm.

In accordance with an embodiment of the present invention, an operation method of a flash memory system including a controller, a memory device, and a host, may include: obtaining first syndrome values by performing a first syndrome operation to a codeword provided from the memory device; obtaining locations of errors and a number of the locations of errors, which are included in the codeword, based on the first syndrome values; error-correcting the codeword by flipping bit values of error bits of the codeword through error-correction bit values based on the locations of errors to generate an error-corrected codeword; obtaining second syndrome values by performing a second syndrome operation to the error-correction bit values; determining whether an error is found in the error-correction bit values by comparing the first syndrome values and the second syndrome values; providing the error-corrected codeword and a success flag to the host when it is determined that the first syndrome value and the second syndrome values are the same as each other; and restoring the error-corrected codeword to the codeword by re-flipping the flipped bit values of the error-corrected codeword when the first syndrome value and the second syndrome values are not the same as each other and providing the restored codeword and a failure flag to the host.

The operation method may further include storing the first syndrome values to a first syndrome buffer; and storing the second syndrome values to a second syndrome buffer. The obtaining of the locations of errors and the number of the locations of errors may comprise generating an error location polynomial based on the first syndrome values; and obtaining the locations of errors and the number of the locations of errors based on the error location polynomial. The error location polynomial is generated using the Berleykamp-Massey algorithm or the Euclidian algorithm, and wherein the locations of errors and the number of the locations of errors are obtained on the basis of the error location polynomial using the Chien search algorithm. The operation method may further comprise changing a value of '1' in the first syndrome values to a value of '0', or replacing the first syndrome values with the second syndrome values when it is determined that the first syndrome value and the second syndrome values are the same as each other.

In accordance with an embodiment of the present invention, a flash memory system may include: a memory device; and a controller suitable for controlling a transfer of a codeword between the memory device and a host, wherein the controller comprises an error correction decoder suitable for performing an ECC operation on the codeword, wherein the codeword is provided from the memory device, wherein the error correction decoder may comprise: a first syndrome calculation block suitable for calculating a first syndrome values from the codeword; a key-equation solver block suitable for generating an error location polynomial based on the first syndrome values; a chien search block suitable for obtaining locations of errors and a number of the locations of errors based on the error location polynomial; a first error correction block suitable for error-correcting the codeword by flipping bit values of the error bits of the codeword based on the locations of errors to generate an error-corrected codeword; a second syndrome calculation block suitable for determining whether an error is found in the error-corrected codeword by calculating a second syndrome values from the error-corrected codeword; a second error correction block suitable for restoring the error-corrected codeword to the codeword by re-flipping the flipped bit values of the error-corrected codeword to generate an restored codeword when it is determined that an error is found in the error-corrected codeword; a setting block suitable for changing the first syndrome values when it is determined that no error is found in the error-corrected codeword includes one or more errors; and an output block suitable for providing the error-corrected codeword or the restored codeword according to the second syndrome values of the second syndrome calculation block.

The flash memory system may store the first syndrome values to a first syndrome buffer, and stores the second syndrome values to a second syndrome buffer. The setting block may change a value of '1' in the first syndrome values to a value of '0', or replacing the first syndrome values with the second syndrome values. The error location polynomial may be generated using the Berleykamp-Massey algorithm or the Euclidian algorithm, and the locations of errors and the number of the locations of errors may be obtained on the basis of the error location polynomial using the Chien search algorithm. The output block may provide the error-corrected codeword and a success flag to the host when it is determined that the error-corrected codeword includes no error, and the output block may provide the restored codeword and a failure flag to the host when it is determined that the error-corrected codeword includes one or more errors. The flash memory system further may comprise a comparison block suitable for comparing a degree of the error location polynomial with the number of the locations of errors. The first error correction block may error-correct the codeword by flipping the bit values of the error bits of the codeword based on the locations of errors when the degree of the error location polynomial and the number of the locations of errors are the same as each other. The output block may provide the codeword and a failure flag to the host when the degree of the error location polynomial and the number of the locations of errors are not the same as each other. The second syndrome calculation block may provide the error-corrected codeword to the output block when the error-corrected codeword includes no error. The flash memory system further may include a third syndrome calculation block suitable for calculating a third syndrome values from the restored codeword. The flash memory system may store the first syndrome values in a syndrome buffer, store the second syndrome values in the syndrome buffer by overwriting the first syndrome values, and store the third syndrome values in the syndrome buffer by overwriting the second syndrome values.

In accordance with an embodiment of the present invention, a flash memory system may include: a memory device; and a controller suitable for controlling a transfer of a codeword between the memory device and a host, wherein the controller comprises an error correction decoder suitable for performing an ECC operation to the codeword provided from the memory device, wherein the error correction decoder comprises: a first syndrome calculation block suitable for calculating first syndrome values from the codeword; a key-equation solver block suitable for generating an error location polynomial based on the first syndrome values; a chien search block suitable for obtaining locations of errors and a number of the locations of errors, which are included in the codeword, based on the error location polynomial; a second syndrome calculation block suitable for determining whether or not the codeword is error-correctable by calculating second syndrome values from the codeword based on the locations of errors; a first error correction block suitable for error-correcting the codeword based on the locations of errors when it is determined that the codeword is error-correctable; and an output block suitable for providing the error-corrected codeword and a success flag to the host.

The output block may provide the codeword and a failure flag to the host when it is determined that the codeword is not error-correctable. The flash memory system further may comprise a setting block suitable for changing the first syndrome values after the error-correction of the codeword by the first error correction block. The setting block may change a value of '1' in the first syndrome values to a value of '0', or replace the first syndrome values with the second syndrome values. The error location polynomial may be generated using the Berleykamp-Massey algorithm or the Euclidian algorithm, and the locations of errors and the number of the locations of errors may be obtained on the basis of the error location polynomial using the Chien search algorithm.

In accordance with an embodiment of the present invention, a flash memory system may include: a memory device; and a controller suitable for controlling a transfer of a codeword between the memory device and a host, wherein the controller comprises an error correction decoder suitable for performing an ECC operation to the codeword provided from the memory device, wherein the error correction decoder comprises: a first syndrome calculation block suitable for calculating first syndrome values from the codeword; a key-equation solver block suitable for generating an error location polynomial based on the first syndrome values; a chien search block suitable for obtaining locations of errors and a number of the locations of errors, which are included in the codeword, based on the error location polynomial; a first error correction block suitable for error-correcting the codeword by flipping bit values of error bits of the codeword through error-correction bit values based on the locations of errors to generate an error-corrected codeword; a second syndrome calculation block suitable for calculating second syndrome values from the error-correction bit values; a determination block suitable for determining whether an error is found in the error-correction bit values by comparing the first syndrome values and the second syndrome values; and an output block suitable for providing the error-corrected codeword and a success flag to the host when it is determined that the first syndrome value and the second syndrome values are the same as each other. The flash memory system may store the first syndrome values in a first syndrome buffer, and store the second syndrome values in a second syndrome buffer. The flash memory system further may include a second error correction block suitable for restoring the error-corrected codeword to the codeword by re-flipping bit values of the error-corrected codeword based on the locations of errors when it is determined that the first syndrome value and the second syndrome values are not the same as each other. The output block may provide the restored codeword and a failure flag to the host. The key-equation solver block may generate the error location polynomial using the Berleykamp-Massey algorithm or the Euclidian algorithm. The chien search block may obtain the locations of errors and the number of the locations of errors on the basis of the error location polynomial using the Chien search algorithm. The flash memory system further may include a setting block suitable for changing the first syndrome values when it is determined that the first syndrome values and the second syndrome values are the same as each other, wherein the setting block may change a value of '1' in the first syndrome values to a value of '0', or replaces the first syndrome values with the second syndrome values.

In accordance with various embodiments of the present invention, the flash memory system may perform a plurality of syndrome calculations, and thus may error-correct the error bits efficiently.

DETAILED DESCRIPTION

Figure 1:
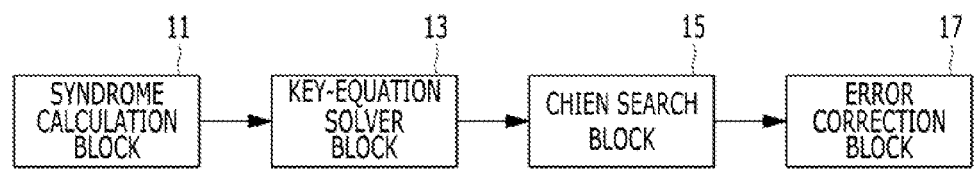
FIG. 1 is a block diagram illustrating the BCH code decoder.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated to clearly illustrate features of the embodiments. Throughout the disclosure, reference numerals correspond directly to like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case in which the first layer is formed directly on the second layer or the substrate but also a case in which a third layer exists between the first layer and the second layer or the substrate.

Figure 2:
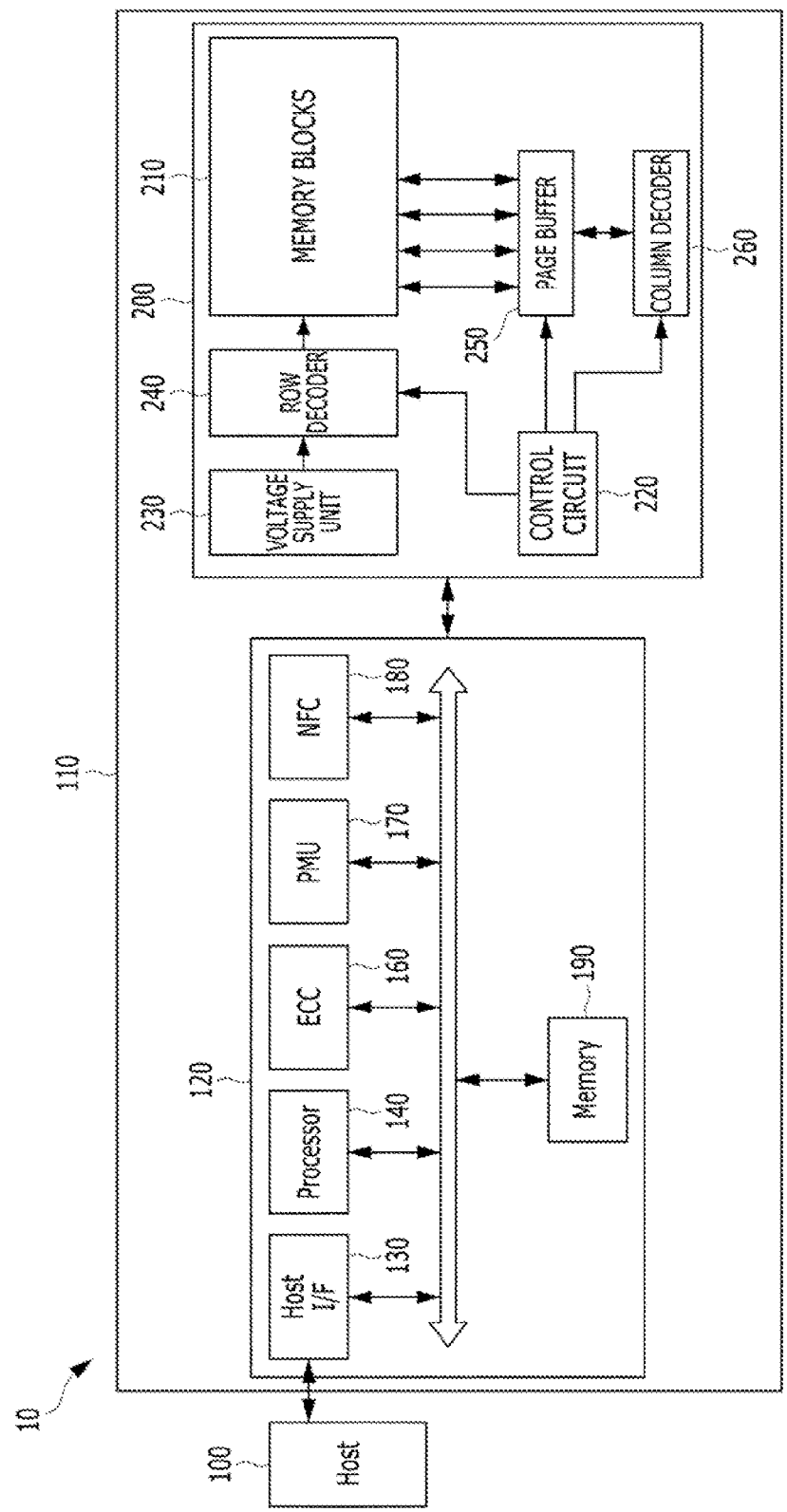
FIG. 2 is a block diagram illustrating a data processing system in accordance with an embodiment of the present invention.

FIG. 2 is a block diagram illustrating a data processing system 10 in accordance with an embodiment of the present invention. Referring to FIG. 2, the data processing system 10 may include a host 100 and a memory system 110. For example, the host 100 may include a portable electronic device such as a mobile phone, an MP3 player, a laptop computer, and so forth. The host 100 may include an electronic device such as a desktop computer, a game player, a TV, a projector, and so forth.

The memory system 110 may operate in response to a request of the host 100, and may store data to be accessed by the host 100. That is, the memory system 110 may serve as a main storage device or an auxiliary storage device. The memory system 110 may be implemented with one of various storage devices according to a host interface protocol coupled to the host 100. For example, the memory system 110 may be implemented with one of the various storage devices such as a solid-state drive (SSD), a multimedia card (MMC), an embedded MMC (eMMC), a reduced-size MMC (RS-MMC), and a micro-size version of MMC (MMCmicro), a secure digital (SD) card, a mini secure digital (miniSD) card, a micro secure digital (microSD) card, an universal storage bus (USB) storage device, a universal flash storage (UFS) device, compact flash (CF) card, a smart media (SM) card, a memory stick, and so forth.

A memory system 110 may include a semiconductor memory device 200 for storing data to be accessed by the host 100, and a memory controller 120 for controlling data storage to the semiconductor memory device 200. The semiconductor memory device 200 may be implemented with a volatile memory device such as a dynamic random access memory (DRAM) and a static RAM (SRAM), and a nonvolatile memory device such as a read only memory (ROM), a mask ROM (MROM), a programmable ROM (PROM), an erasable and programmable ROM (EPROM), an electrically erasable and programmable ROM (EEPROM), a ferroelectric ROM (FRAM), a phase change RAM (PRAM), a magnetic RAM (MRAM), a resistive RAM (RRAM) and a flash memory.

The memory controller 120 and the semiconductor memory device 200 may be integrated as a single semiconductor device. For example, the memory controller 120 and the semiconductor memory device 200 may be integrated as a single semiconductor device to form an SSD. The SSD may include a storage device for storing data in a semiconductor memory. When the memory system 110 is used as the SSD, operation speed of the host 100 coupled to the memory system 110 may be improved.

The memory controller 120 and the semiconductor memory device 200 may be integrated as a single semiconductor device to configure a memory card. For example, the memory controller 120 and the semiconductor memory device 200 may be integrated as a single semiconductor device to form a memory card such as a PC card of the personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 110 may be provided as one of various elements forming an electronic device, such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices for a home network, one of electronic devices for a computer network, one of electronic devices for a telematics network, a radio-frequency identification (RFID) device, or elements of devices for a computing system.

The semiconductor memory device 200 may retain stored data even when power is interrupted. The semiconductor memory device 200 may store data provided from the host 100 through the write operation, and may provide stored data to the host 100 through the read operation.

The semiconductor memory device 200 may include a memory block 210, a control circuit 220, a voltage supply unit 230, a row decoder 240, a page buffer 250, and a column decoder 260. The semiconductor memory device 200 may be the nonvolatile memory device, for example the flash memory device. The semiconductor memory device 200 may have a 3-dimensional stacked structure.

The memory block 210 may include a plurality of pages, each of which includes a plurality of memory cells coupled to a plurality of word lines.

The control circuit 220 may control various operations related to program, erase, and read operations of the semiconductor memory device 200.

The voltage supply unit 230 may provide word lines voltages, for example, a program voltage, a read voltage, and a pass voltage, to the respective word lines according to an operation mode, and may provide a voltage to be supplied to a bulk, for example, a well region, in which the memory cells are formed. A voltage generating operation of the voltage supply circuit 230 may be performed under control of the control logic 220. The voltage supply unit 230 may generate a plurality of variable read voltages for generation of a plurality of read data.

The row decoder 240 may select one of the memory blocks or sectors of the memory cell array 210, and may select one among the word lines of the selected memory block under the control of the control logic 220. The row decoder 240 may provide the word line voltage generated from the voltage supply circuit 230 to selected word lines or non-selected word lines under the control of the control logic 220.

During the program operation, the page buffer 250 may operate as a write driver for driving the bit lines according to data to be stored in the memory block 210. During the program operation, the page buffer 250 may receive the data to be written in the memory block 210 from a buffer (not illustrated), and may drive the bit lines according to the input data. The page buffer 250 may be formed of a plurality of page buffers (PB) 251 corresponding to the columns or the bit lines, or column pairs or bit line pairs, respectively. A plurality of latches may be included in each of the plurality of page buffers 251.

The memory controller 120 of the memory system 110 may control the semiconductor memory device 200 in response to a request from the host 100. For example, the memory controller 120 may provide data read from the semiconductor memory device 200 to the host 100, and may store data from the host 100 into the semiconductor memory device 200. The memory controller 120 may control the read, write, program, and erase operations of the semiconductor memory device 200.

The memory controller 120 may include a host interface unit 130, a processor 140, an error correction code (ECC) unit 160, a power management unit (PMU) 170, a NAND flash controller (NFC) 180, and a memory 190.

The host interface 140 may process a command and data from the host 100 and may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 160 may detect and correct an error included in data read from the memory block 210 during the read operation. The ECC unit 160 may perform the ECC decoding on the data read from the memory block 210, determine whether the ECC decoding succeeds, output an instruction signal according to the determination result, and correct error bits of the read data using parity bits generated during the ECC encoding. When a number of error bits included in the read data is beyond the error-correction capability of the ECC unit 160, the ECC unit may not correct the error bits, and thus may output an error correction fail signal.

The ECC unit 160 may correct an error through a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a block coded modulation (BCM), and so on. The ECC unit 160 may include an error correction circuit, an error correction system, and an error correction device.

The PMU 170 may provide and manage power to the memory controller 120.

The NFC 180 may serve as an interface between the memory controller 120 and the semiconductor memory device 200 for the memory controller 120 to control the semiconductor memory device 200 in response to the host 100. When the semiconductor memory device 200 is the flash memory device, for example, a NAND flash memory device, the NFC 180 may generate a control signal of the semiconductor memory device 200 and process data under the control of the processor 140.

The memory 190, as an operational memory for the memory system 110 and the memory controller 120, may store data for driving the memory system 110 and the memory controller 120. When the memory controller 120 provides data read from the semiconductor memory device 200 to the host 100, and stores data from the host 100 into the semiconductor memory device 200 through the control of the read, write, program and erase operations of the semiconductor memory device 200 in response to the request of the host 100. Furthermore, the memory 190 may store data for the operation of the memory system 110 or the operation between the memory controller 120 and the semiconductor memory device 200.

The memory 190 may be formed of the volatile memory device such as DRAM or SRAM. The memory 190 may store data for the write and read operations between the memory controller 120 and the semiconductor memory device 200, and data during the write and read operations. To this end, the memory 190 may include a program memory, a data memory, a write buffer, a read buffer, a map buffer, and so forth.

Additionally, the memory 190 may store data for operations between the ECC unit 160 and the processor 140, such as data that is read during read operations. That is, the memory 190 may store data read from the semiconductor memory device 200. The data may include user data, parity data and status data. The status data may include information of which cycling group is applied to the memory block 210 of the semiconductor memory device 200 during the program operation.

The processor 140 may perform various control operations of the memory system 110. The processor 140 may control the write operation or the read operation to the semiconductor memory device 200 in response to the write request or the read request of the host 100. The processor 140 may drive firmware referred to as the flash translation layer (FTL) for general control of the memory system 110. The processor 140 may be formed of a microprocessor or a central processing unit (CPU).

Figure 3A:
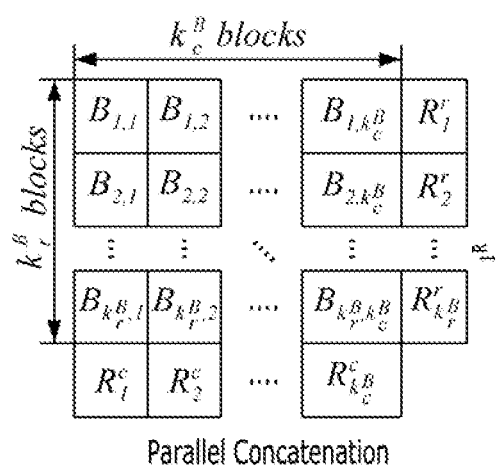
FIG. 3A is a diagram for describing a block-wise concatenated BCH code that is concatenated in parallel.
Figure 3B:
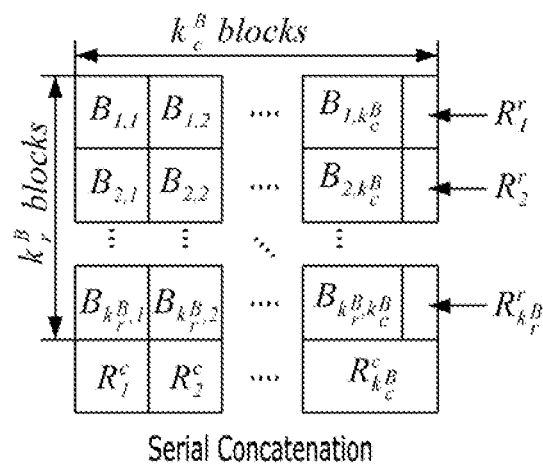
FIG. 3B is a diagram for describing a block-wise concatenated BCH code that is concatenated in series.

FIG. 3A is a diagram for describing a BC-BCH code that is concatenated in parallel that is, a parallel-concatenated BC-BCH code. FIG. 3B is a diagram for describing a BC-BCH code that is concatenated in series that is, a serial-concatenated BC-BCH code.

The block of the BC-BCH code is different from the memory block. The block of the BC-BCH code is a bundle of bits, which are sequentially arranged in line, although the block of the BC-BCH code is illustrated as a square in FIGS. 3A and 3B. The BC-BCH code may include a message block and a parity block, or may include a message-parity block in which the message block is combined with the parity block.

The BC-BCH code may include 2 kinds of the BCH constituent codes: a row BCH constituent code and a column BCH constituent code. The row BCH constituent code may be the same as the column BCH constituent code in the parallel-concatenated BC-BCH code.

In the serial-concatenated BC-BCH code, the row BCH constituent code may serve as an outer code and the column BCH constituent code may serve as an inner code. A single row BCH constituent code may share a single block of BC-BCH code with a single column BCH constituent code. A single row BCH constituent code may share a single block with each of the column BCH constituent codes. A single column BCH constituent code may share a single block with each of the row BCH constituent codes.

Both of the row BCH constituent code and the column BCH constituent code are BCH codes. The row BCH constituent code may correct $t_r$ bit-errors in $n_r$ bits having $k_r$ bits of a message to be protected and $m_r$ parity bits. The column BCH constituent code may correct $t_c$ bit-errors in $n_c$ bits having $k_c$ bits of a message to be protected and $m_c$ parity bits. Hereinafter, it is presumed that the amount of data to be protected by the BC-BCH code is k, where k is a natural number.

Referring to FIG. 3A, the data may correspond to a message matrix the size of which is $k_r^B \times k_c^B$ of message blocks $B_{i,j}$. A single row BCH constituent code may include $k_c^B$ message blocks and one or more parity blocks. A single column BCH constituent code may include $k_r^B$ message blocks and one or more parity blocks.

For example, the BC-BCH code may include a plurality of message blocks, each of which is $n_B$ bits. Referring to FIG. 3A, an $i^{th}$ row BCH constituent code may include the message blocks of the $i^{th}$ row and the parity blocks of the $i^{th}$ row, as shown in Equation 1.

$$C_i^r = [B_{i,1} \ldots B_{i,k_r^B} R_i^r] \qquad \text{[Equation 1]}$$

Referring to FIG. 3A, $j^{th}$ column BCH constituent code may include the message blocks of the $j^{th}$ column and the parity blocks of the $j^{th}$ column, as shown in Equation 2.

$$C_j^c = [B_{1,j}, \ldots B_{k_r^B,j}, R_j^c] \quad \text{[Equation 2]}$$

The message length of the row BCH constituent code is shown in Equation 3.

$$k_r = k/k_r^B = n_B \times k_c^B \quad \text{[Equation 3]}$$

The code length of the row BCH constituent code is shown in Equation 4.

$$n_r = k_r + m_r \quad \text{[Equation 4]}$$

The message length of the column BCH constituent code is shown in Equation 5.

$$k_c = k/k_c^B = n_B \times k_r^B \quad \text{[Equation 5]}$$

The code length of the column BCH constituent code is shown in Equation 6.

$$n_c = k_c + m_c \quad \text{[Equation 6]}$$

The code rate of the BC-BCH code is shown in Equation 7.

$$R = k/(k + m_r k_r^B + m_c k_c^B) \quad \text{[Equation 7]}$$

In the above case, a single message block may include $n_B = k/(k_r^B \times k_c^B)$ bits, which is the same as each of the other message blocks.

In order for row BCH constituent codes to have different sizes of message block from each other and for all the message blocks in a single row of BCH constituent code to have the same size, the $i^{th}$ row BCH constituent code may include the message blocks of the $i^{th}$ row and the parity blocks of the $i^{th}$ row, as shown in Equation 1, and the $j^{th}$ column BCH constituent code may include the message blocks of the $j^{th}$ column and the parity blocks of the $j^{th}$ column, as shown in Equation 8.

$$C_j^c = [B_{1,f(j)} B_{2,f(j+1)} \ldots B_{k_r^B,f(j+k_r^B-1)} R_j^c] \quad \text{[Equation 8]}$$

Here, $f(x) = \{(x-1) \mod k_c^B\} + 1$

Referring to FIG. 3B, the data may be assigned to the message block, and the last block of each row BCH constituent code may be the parity block for the row BCH constituent code or the message-parity block for the row BCH constituent code. Except for the parity block for the column BCH constituent code, the message matrix may have the size of $k_r^B \times k_c^B$ and include the message blocks, the message-parity block for the row BCH constituent code, and an extra parity block in each row. A single row BCH constituent code may include $k_c^B - 1$ message blocks and a single message-parity block. A single column BCH constituent code may include message blocks or the message-parity blocks $k_r^B$ and a single parity block. The serial-concatenated BC-BCH code may be designed so that the row BCH constituent code may correct more errors than the column BCH constituent code may correct ($t_r \leq t_c$).

For example, the serial-concatenated BC-BCH code may be designed so that each of the message blocks and the message-parity blocks may include $n_e$ bits. Referring to FIG. 3B, $i^{th}$ row BCH constituent code may include the message blocks and the parity blocks of the $i^{th}$ row as shown in Equation 1.

Referring to FIG. 3B, $j^{th}$ column BCH constituent code may include the message blocks and the parity blocks of a $j^{th}$ column as shown in Equation 9 when $1 \leq j \leq k_c^B$.

$$C_j^c = [B_{1,j}, \ldots B_{k_r^B,j}, R_j^c] \quad \text{[Equation 9]}$$

The $j^{th}$ column BCH constituent code may include the message blocks and the parity blocks of $j^{th}$ column as shown in Equation 10, when $j = k_c^B$.

$$C_j^c = [\{B_{1,j}, R_1^r\} \ldots \{B_{k_r^B,j}, R_{k_r^B}^r\} R_j^c] \quad \text{[Equation 10]}$$

The length of the message of the row BCH constituent code may be represented as shown in Equation 11.

$$k_r = k/k_r^B \quad \text{[Equation 11]}$$

The length of the code of the row BCH constituent code may be represented as shown in Equation 12.

$$n_r = k_r + m_r = n_B \times k_c^B \quad \text{[Equation 12]}$$

The length of the message of the column BCH constituent code may be represented as shown in Equation 13.

$$k_c = n_B \times k_r^B \quad \text{[Equation 13]}$$

The length of the code of the column BCH constituent code may be represented as shown in Equation 6.

The code rate of the serial-concatenated BC-BCH code may be represented in Equation 7.

In the serial-concatenated BC-BCH code, each of the message blocks and the message-parity blocks has the same number of bits, which is represented as follows.

$$n_B = (k + m_r \times k_r^B)/(k_r^B \times k_c^B) = n_r/k_c^B.$$

In order for row BCH constituent codes to have different sizes of message block from each other and for all the message blocks in a single row BCH constituent code to have the same size, the row BCH constituent code and the column BCH constituent code may be represented similarly to the above-described Equations 1 and 8, respectively.

For convenience of Illustration, the parallel-concatenated BC-BCH code will be described hereinafter. However, an embodiment of the present application is not limited thereto and will be applied to the serial-concatenated BC-BCH code, as well.

Figure 4:
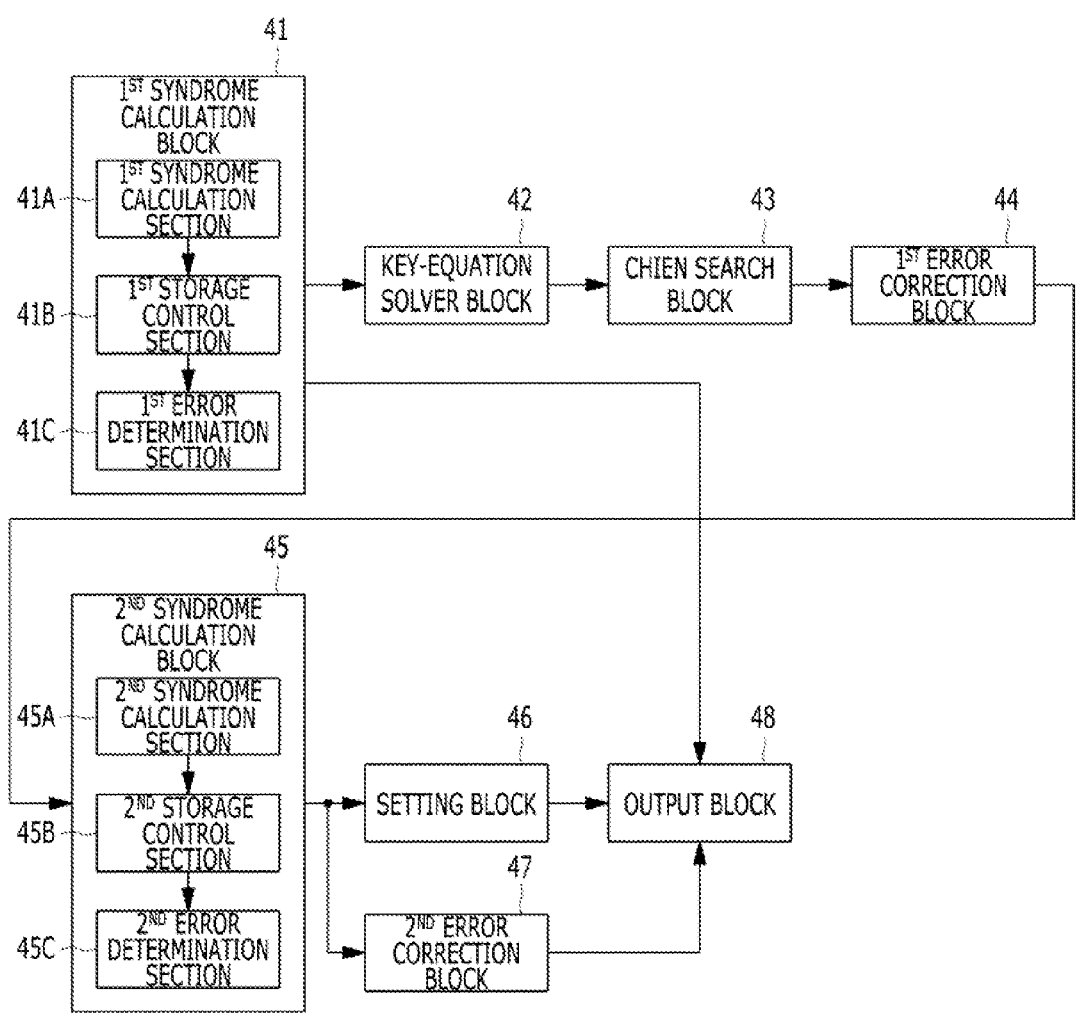
FIG. 4 is a block diagram illustrating an error correction code decoder in accordance with a first embodiment of the present invention.

FIG. 4 is a block diagram illustrating an error correction code decoder in accordance with a first embodiment of the present invention. Referring to FIG. 4, the first embodiment of the present invention may be an error correction code decoder. FIG. 4 shows a decoder of the Bose-Chadhuri-Hocquenghem (BCH) code included in the concatenated BCH code. The error correction code decoder may use the concatenated BCH code, the hamming code, and the Reed-Solomon code.

Referring to FIG. 4, the error correction code decoder may include a first syndrome calculation block 41, a key-equation solver block 42, a chien search block 43, a first error correction block 44, a second syndrome calculation block 45, a setting block 46, a second error correction block 47, and an output block 48.

The first syndrome calculation block 41 may include a first syndrome calculation section 41A, a first storage control section 41B, and a first error determination section 41C.

The first syndrome calculation section 41A may receive a BCH codeword from the non-volatile memory device 200.

The first syndrome calculation section 41 may calculate first syndrome values from the BCH codeword, and may provide the first syndrome values to the first storage control section 41B.

The first storage control section 41B may store the first syndrome values, which are calculated by the first syndrome calculation section 41A, to a first syndrome buffer.

The first error determination section 41C may determine whether or not the BCH codeword has an error through the first syndrome values stored in the first syndrome buffer.

When all of the first syndrome values are '0' and thus the BCH codeword does not include any error as the result of the determination, the first error determination section 41C may provide the BCH codeword and a success flag to the output block 48 in order to provide the BCH codeword and the success flag to the host.

When one or more of the first syndrome values are not '0' and thus the BCH codeword includes one or more errors as the result of the determination, the first error determination section 41C may provide the first syndrome values to the key-equation solver block 42 in order to error-correct the BCH codeword.

The key-equation solver block 42 may generate the error location polynomial (ELP) based on the first syndrome values in order to solve the key-equation. The key-equation solver block 42 may use the Berleykamp-Massey (BM) algorithm or the Euclidian algorithm. For example, the key-equation solver block 42 may generate the ELP based on the first syndrome values through the BM algorithm. The key-equation solver block 42 may provide the ELP to the chien search block 43.

The chien search block 43, using the chien search algorithm, may calculate locations of errors and the number of the locations of errors in the BCH codeword through the ELP generated by the key-equation solver block 42.

The first error correction block 44 may error-correct error bits of the BCH codeword corresponding to the locations of errors. The first error correction block 44 may error-correct the BCH codeword by flipping bit values of the error bits of the BCH codeword, and may output an error-corrected BCH codeword. The first error correction block 44 may provide the error-corrected BCH codeword to the second syndrome calculation block 45.

The second syndrome calculation block 45 may include a second syndrome calculation section 45A, a second storage control section 45B, and a second error determination section 45C.

The second syndrome calculation section 45A may perform a second syndrome operation by calculating second syndrome values from the error-corrected BCH codeword, and may provide the second syndrome values to the second storage control section 45B. Through the second syndrome operation with the error-corrected BCH codeword provided from the first error correction block 44, the BCH codeword provided from the non-volatile memory device 200 may be determined to be correctly error-corrected or not.

The second storage control section 45B may store the second syndrome values, which are calculated by the second syndrome calculation section 45A, to a second syndrome buffer.

The second error determination section 45C may determine whether or not the error-corrected BCH codeword has an error through the second syndrome values stored in the second syndrome buffer. That is, through the second syndrome operation with the error-corrected BCH codeword provided from the first error correction block 44, the BCH codeword provided from the non-volatile memory device 200 may be determined to be correctly error-corrected or not.

When all of the second syndrome values are '0' and thus the error-corrected BCH codeword does not include any error as the result of the determination, the second error determination section 45C may provide the second syndrome values to the setting block 46.

When one or more of the second syndrome values are not '0' and thus the error-corrected BCH codeword includes one or more errors as the result of the determination, the second error determination section 45C may provide the error-corrected BCH codeword to the second error correction block 47 in order to restore the error-corrected BCH codeword to the BCH codeword, which is then provided to the first syndrome calculation block 41.

The setting block 46 may change the values of the first syndrome buffer from the first syndrome values to '0'. When the second error determination section 45C provides the error-corrected BCH codeword to the setting block 46, the error-corrected BCH codeword may be determined as including no error or the error-corrected BCH codeword may be determined as being correctly error-corrected through the second syndrome values. Thus, the setting block 46 may change the values of the first syndrome buffer from the first syndrome values to '0'.

For the change of the values of the first syndrome buffer from the first syndrome values to '0', the setting block 46 may change the values of '1' in the first syndrome values to the value '0', or may store the second syndrome values, which are generated by the second syndrome calculation block 45, into the first syndrome buffer.

The second error correction block 47 may restore the error-corrected BCH codeword, which is provided from the second error determination section 45C, to the BCH codeword, which is provided from the non-volatile memory device 200 to the first syndrome calculation block 41, by re-flipping the bit values, which have been previously flipped by the first error correction block 44, in the error-corrected BCH codeword. The second error correction block 47 may output a restored BCH codeword, which is the BCH codeword restored from the error-corrected BCH codeword. The second error correction block 47 may output the restored BCH codeword since the error-corrected BCH codeword, which is not correctly error-corrected, may have more errors than the original BCH codeword.

The output block 48 may transfer the BCH codeword and the success flag from the first syndrome calculation block 41 to the host when all of the first syndrome values are '0' and thus the BCH codeword does not include any error.

Also, the output block 48 may transfer the error-corrected BCH codeword and the success flag from the second syndrome calculation block 45 to the host when all of the second syndrome values are '0' and thus the error-corrected BCH codeword does not include any error.

However, the output block 48 may transfer the restored BCH codeword and a failure flag from the second error correction block 47 to the host when one or more of the second syndrome values are not '0' and thus the error-corrected BCH codeword includes one or more errors.

Figure 5:
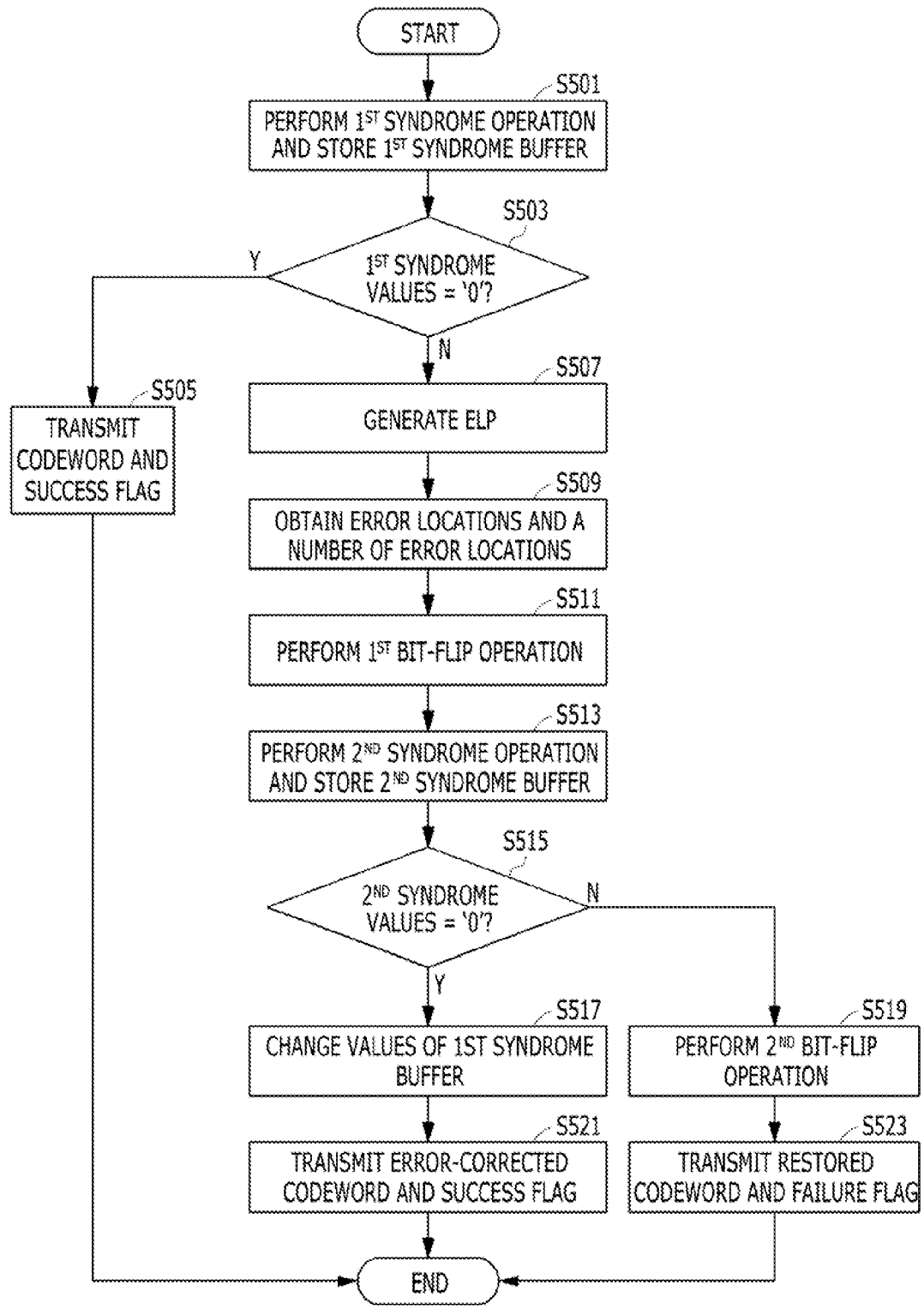
FIG. 5 is a flowchart illustrating an operation of a flash memory system in accordance with the first embodiment of the present invention.

FIG. 5 is a flowchart illustrating an operation of a flash memory system in accordance with a first embodiment of the present invention. The flash memory system may receive a BCH codeword from the non-volatile memory device 200 (shown in FIG. 2).

Referring to FIG. 5, at step S501, the flash memory system may perform a first syndrome operation by calculating first syndrome values from the BCH codeword. The flash memory system may store the first syndrome values to a first syndrome buffer.

At step S503, the flash memory system may determine whether or not the BCH codeword has an error through the first syndrome values stored in the first syndrome buffer.

When all of the first syndrome values are '0' and thus the BCH codeword does not include any error as the result of the determination of step S503 ("Y"), the BCH codeword may not need the error correction and thus the flash memory system may provide the BCH codeword as is and a success flag to the host at step S505.

When one or more of the first syndrome values are not '0' and thus the BCH codeword includes one or more errors as the result of the determination of step S503 ("N"), the flash memory system may generate the error location polynomial (ELP) based on the first syndrome values in order to error-correct the BCH codeword at step S507. The flash memory system may generate the ELP through the key-equation solver. The key-equation solver may use the Berleykamp-Massey (BM) algorithm or the Euclidian algorithm. For example, the key-equation solver may generate the ELP based on the first syndrome values through the BM algorithm.

At step S509, the flash memory system may calculate locations of errors and the number of the locations of errors in the BCH codeword through the ELP. The flash memory system may use the Chien search algorithm and may generate an error polynomial. Coefficients of the error polynomial may represent the locations of the error bits.

At step S511, the flash memory system may perform a first bit-flip operation in order to error-correct the error bits of the BCH codeword corresponding to the locations of errors. The flash memory system may error-correct the BCH codeword by flipping bit values of the error bits of the BCH codeword corresponding to the locations of errors, and may output an error-corrected BCH codeword.

At step S513, the flash memory system may perform a second syndrome operation by calculating second syndrome values from the error-corrected BCH codeword. Through the second syndrome operation with the error-corrected BCH codeword, the BCH codeword provided from the non-volatile memory device 200 may be determined to be correctly error-corrected or not. The flash memory system may store the second syndrome values to a second syndrome buffer.

At step S515, the flash memory system may determine whether or not the error-corrected BCH codeword has an error through the second syndrome values stored in the second syndrome buffer. That is, it is determined whether or not all of the second syndrome values are '0'.

When all of the second syndrome values are '0' and thus the error-corrected BCH codeword does not include any error as the result of the determination of step S515 ("Y"), the flash memory system may change the values of the first syndrome buffer from the first syndrome values to '0' at step S517. The error-corrected BCH codeword may be determined not to include any error or the error-corrected BCH codeword may be determined to be correctly error-corrected through the second syndrome values, and thus the flash memory system may change the values of the first syndrome buffer from the first syndrome values to '0'.

For the change of the values of the first syndrome buffer from the first syndrome values to '0', the flash memory system may change the values of '1' in the first syndrome values to the value '0', or may store the second syndrome values into the first syndrome buffer.

At step S521, the flash memory system may transfer the error-corrected BCH codeword and the success flag to the host when all of the second syndrome values are '0' and thus the error-corrected BCH codeword does not include any error.

However, when one or more of the second syndrome values are not '0' and thus the error-corrected BCH codeword includes one or more errors as the result of the determination of step S515 ("N"), the flash memory system may perform a second bit-flip operation to the bit values of the bits corresponding to the locations of errors obtained from the error-corrected BCH codeword by the Chien search algorithm at step S519.

The flash memory system may restore the error-corrected BCH codeword to the BCH codeword, which is used for the first syndrome operation of step S501, by re-flipping the bit values corresponding to the locations of errors obtained at step S509, in the error-corrected BCH codeword. The flash memory system may output a restored BCH codeword, which is the BCH codeword restored from the error-corrected BCH codeword. The flash memory system may output the restored BCH codeword since the error-corrected BCH codeword, which is not correctly error-corrected, may have more errors than the original BCH codeword.

At step S523, the flash memory system may transfer the restored BCH codeword and a failure flag to the host when one or more of the second syndrome values are not '0' and thus the error-corrected BCH codeword includes one or more errors.

Figure 6:
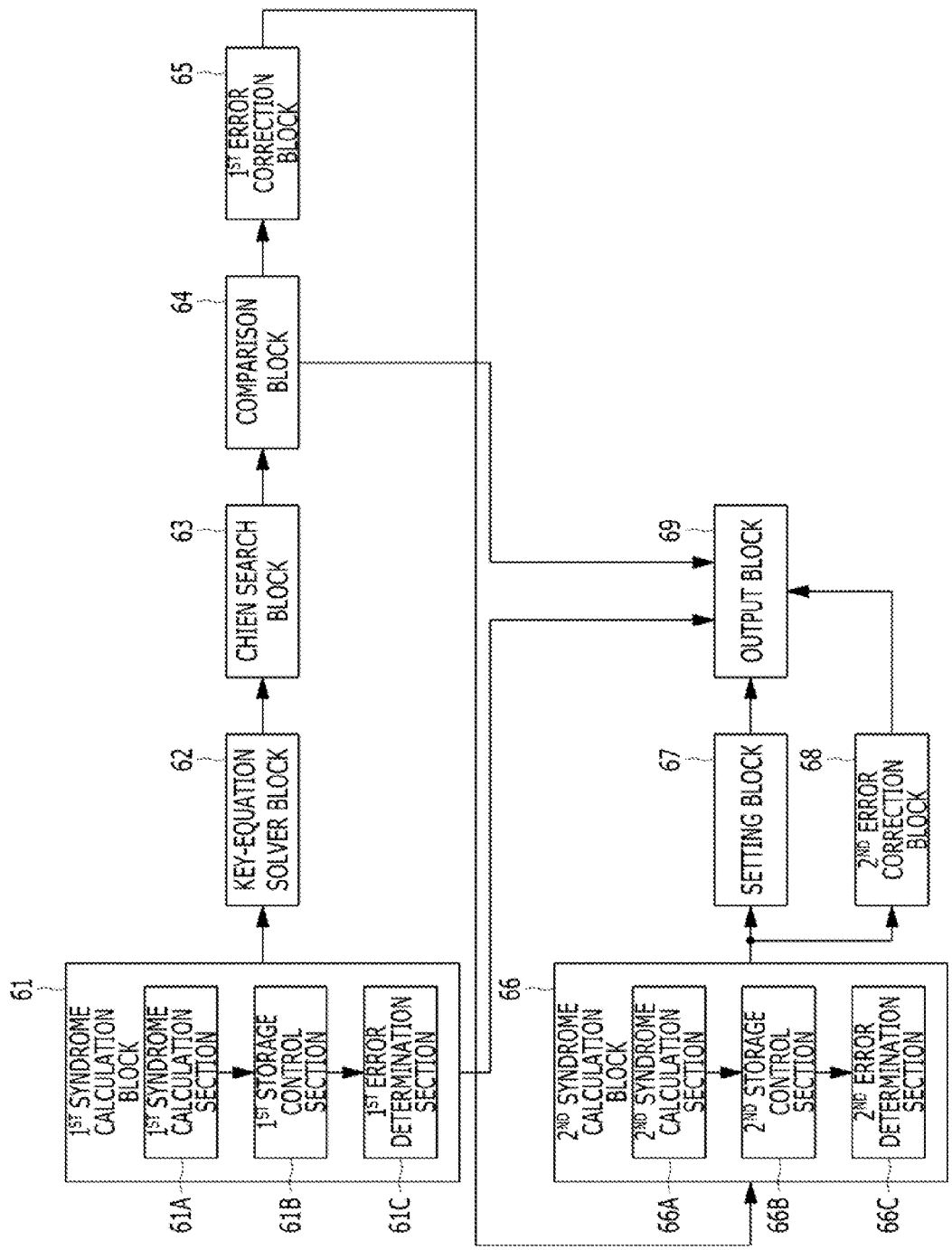
FIG. 6 is a block diagram illustrating an error correction code decoder in accordance with a second embodiment of the present invention.

FIG. 6 is a block diagram illustrating an error correction code decoder in accordance with a second embodiment of the present invention. Referring to FIG. 6, the second embodiment of the present invention may be an error correction code decoder. FIG. 6 shows a decoder of the Bose-Chadhuri-Hocquenghem (BCH) code included in the concatenated BCH code. The error correction code decoder may use the concatenated BCH code, the hamming code, and the Reed-Solomon code.

Referring to FIG. 6, the error correction code decoder may include a first syndrome calculation block 61, a key-equation solver block 62, a chien search block 63, a comparison block 64, a first error correction block 65, a second syndrome calculation block 66, a setting block 67, a second error correction block 68, and an output block 69.

The first syndrome calculation block 61 may include a first syndrome calculation section 61A, a first storage control section 61B, and a first error determination section 61C. The first syndrome calculation section 61A may receive a BCH codeword from the non-volatile memory device 200. The first syndrome calculation section 61 may calculate first syndrome values from the BCH codeword, and may provide the first syndrome values to the first storage control section 61B.

The first storage control section 61B may store the first syndrome values, which are calculated by the first syndrome calculation section 61A, to a first syndrome buffer. The first error determination section 61C may determine whether or not the BCH codeword has an error through the first syndrome values stored in the first syndrome buffer.

When all of the first syndrome values are '0' and thus the BCH codeword does not include any error as the result of the determination, the first error determination section 61C may provide the BCH codeword as is along with a success flag to the output block 69 in order to provide the BCH codeword and the success flag to the host.

When one or more of the first syndrome values are not '0' and thus the BCH codeword includes one or more errors as the result of the determination, the first error determination section 61C may provide the first syndrome values to the key-equation solver block 62 in order to error-correct the BCH codeword.

The key-equation solver block 62 may generate the error location polynomial (ELP) based on the first syndrome values in order to solve the key-equation. The key-equation solver block 62 may use the Berleykamp-Massey (BM) algorithm or the Euclidian algorithm. For example, the key-equation solver block 62 may generate the ELP based on the first syndrome values through the BM algorithm. The key-equation solver block 62 may provide the ELP to the chien search block 63.

The chien search block 63, using the Chien search algorithm, may calculate locations of errors and the number of the locations of errors in the BCH codeword through the ELP generated by the key-equation solver block 62.

The comparison block 64 may compare the degree of the ELP, which is generated by the key-equation solver block 62, with the number of the locations of errors, which are obtained by the chien search block 63. When the degree of the ELP is different from the number of the locations of errors, the comparison block 64 may provide the comparison result of the difference to the output block 68 in order to provide the BCH codeword, the error-correction of which fails, and a failure flag to the host.

When the degree of the ELP is the same as the number of the location of the errors, the comparison block 64 may provide the comparison result of the equality to the first error correction block 65 in order for the first error correction block 65 to error-correct the BCH codeword. Upon receiving the comparison result of the equality from the comparison block 64, the first error correction block 65 may error-correct error bits of the BCH codeword corresponding to the locations of errors obtained by the chien search block 63. The first error correction block 65 may error-correct the BCH codeword by flipping bit values of the error bits of the BCH codeword, and may output an error-corrected BCH codeword. The first error correction block 65 may provide the error-corrected BCH codeword to the second syndrome calculation block 66.

The second syndrome calculation block 66 may include a second syndrome calculation section 66A, a second storage control section 66B, and a second error determination section 66C.

The second syndrome calculation section 66A may perform a second syndrome operation by calculating second syndrome values from the error-corrected BCH codeword, and may provide the second syndrome values to the second storage control section 66B. Through the second syndrome operation with the error-corrected BCH codeword provided from the first error correction block 65, the BCH codeword provided from the non-volatile memory device 200 may be determined to be correctly error-corrected or not. The second storage control section 66B may store the second syndrome values, which are calculated by the second syndrome calculation section 66A, to a second syndrome buffer.

The second error determination section 66C may determine whether or not the error-corrected BCH codeword has an error through the second syndrome values stored in the second syndrome buffer. That is, through the second syndrome operation with the error-corrected BCH codeword provided from the first error correction block 65, the BCH codeword provided from the non-volatile memory device 200 may be determined to be correctly error-corrected or not.

When all of the second syndrome values are '0' and thus the error-corrected BCH codeword does not include any error as the result of the determination, the second error determination section 66C may provide the second syndrome values to the setting block 67.

When one or more of the second syndrome values are not '0' and thus the error-corrected BCH codeword includes one or more errors as the result of the determination, the second error determination section 66C may provide the error-corrected BCH codeword to the second error correction block 68 in order to restore the error-corrected BCH codeword to the BCH codeword, which is provided to the first syndrome calculation block 61.

The setting block 67 may change the values of the first syndrome buffer from the first syndrome values to 'O'. When the second error determination section 66C provides the error-corrected BCH codeword to the setting block 67, the error-corrected BCH codeword may be determined as including no error or the error-corrected BCH codeword may be determined to be correctly error-corrected through the second syndrome values. Thus, the setting block 67 may change the values of the first syndrome buffer from the first syndrome values to '0'.

For the change of the values of the first syndrome buffer from the first syndrome values to '0', the setting block 67 may change the values of '1' in the first syndrome values to the value '0', or may store the second syndrome values, which are generated by the second syndrome calculation block 66, into the first syndrome buffer.

The second error correction block 68 may restore the error-corrected BCH codeword, which is provided from the second error determination section 66C, to the BCH codeword, which is provided from the non-volatile memory device 200 to the first syndrome calculation block 61, by re-flipping the bit values, which have been previously flipped by the first error correction block 65, in the error-corrected BCH codeword. The second error correction block 68 may output a restored BCH codeword, which is the BCH codeword restored from the error-corrected BCH codeword. The second error correction block 68 may output the restored BCH codeword since the error-corrected BCH codeword, which is not correctly error-corrected, may have more errors than the original BCH codeword.

The output block 69 may transfer the BCH codeword and the success flag from the first syndrome calculation block 61 to the host when all of the first syndrome values are '0' and thus the BCH codeword does not include any error.

Additionally, upon receiving the comparison result of the difference from the comparison block 64, the output block 69 may transfer the BCH codeword and the failure flag to the host.

Further, the output block 69 may transfer the error-corrected BCH codeword and the success flag from the second syndrome calculation block 66 to the host when all of the second syndrome values are '0' and thus the error-corrected BCH codeword does not include any error.

However, the output block 69 may transfer the restored BCH codeword and a failure flag from the second error correction block 68 to the host when one or more of the second syndrome values are not '0' and thus the error-corrected BCH codeword includes one or more errors.

Figure 7:
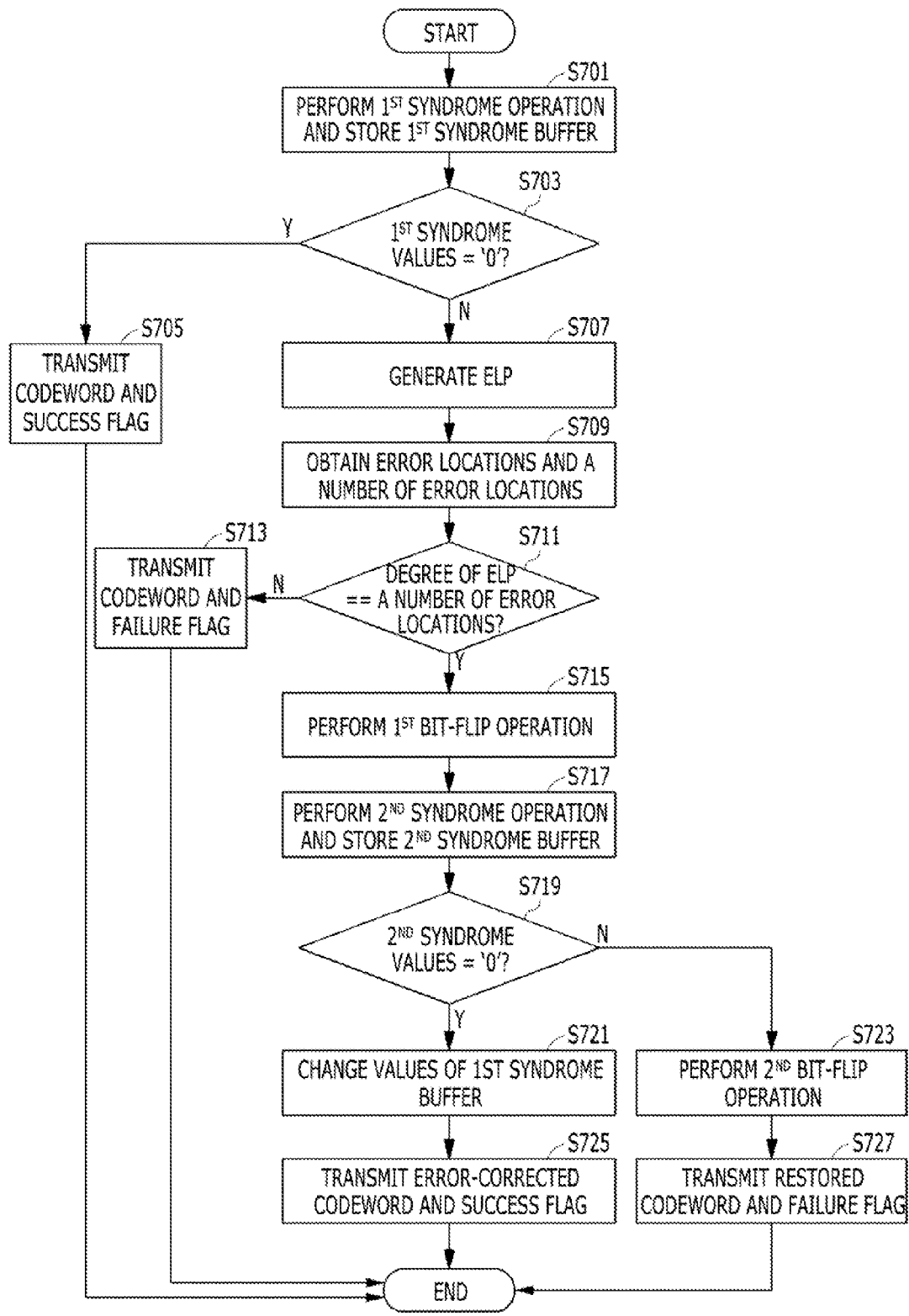
FIG. 7 is a flowchart illustrating an operation of a flash memory system in accordance with the second embodiment of the present invention.

FIG. 7 is a flowchart illustrating an operation of a flash memory system in accordance with a second embodiment of the present invention. The flash memory system may receive a BCH codeword from the non-volatile memory device 200.

Referring to FIG. 7, at step S701, the flash memory system may perform a first syndrome operation by calculating first syndrome values from the BCH codeword. The flash memory system may store the first syndrome values to a first syndrome buffer.

At step S703, the flash memory system may determine whether or not the BCH codeword has an error through the first syndrome values stored in the first syndrome buffer.

When all of the first syndrome values are '0' and thus the BCH codeword does not include any error as the result of the determination of step S703 ("Y"), the BCH codeword may not need the error correction and thus the flash memory system may provide the BCH codeword as is and a success flag to the host at step S705.

When one or more of the first syndrome values are not '0' and thus the BCH codeword includes one or more errors as the result of the determination of step S703 ("N"), the flash memory system may generate the error location polynomial (ELP) based on the first syndrome values in order to error-correct the BCH codeword at step S707. The flash memory system may generate the ELP through the key-equation solver. The key-equation solver may use the Berleykamp-Massey (BM) algorithm or the Euclidian algorithm. For example, the key-equation solver may generate the ELP based on the first syndrome values through the BM algorithm.

At step S709, the flash memory system may calculate locations of errors and the number of the locations of errors in the BCH codeword through the ELP. The flash memory system may use the Chien search algorithm, and may generate an error polynomial. Coefficients of the error polynomial may represent the locations of the error bits.

At step S711, the flash memory system may compare the degree of the ELP with the number of the locations of errors. When the degree of the ELP is different from the number of the locations of errors as a result of the comparison at step S711, the flash memory system may provide the BCH codeword to which the error-correction fails, and a failure flag to the host at step S713.

When the degree of the ELP is the same as the number of the location of the errors as a result of the comparison at step S711, the flash memory system may perform a first bit-flip operation in order to error-correct the error bits of the BCH codeword corresponding to the locations of errors. The flash memory system may error-correct the BCH codeword by flipping bit values of the error bits of the BCH codeword corresponding to the locations of errors, and may output an error-corrected BCH codeword at step S715.

At step S717, the flash memory system may perform a second syndrome operation by calculating second syndrome values from the error-corrected BCH codeword. Through the second syndrome operation with the error-corrected BCH codeword, the BCH codeword provided from the nonvolatile memory device 200 may be determined to be correctly error-corrected or not. The flash memory system may store the second syndrome values to a second syndrome buffer.

At step S719, the flash memory system may determine whether or not the error-corrected BCH codeword has an error through the second syndrome values stored in the second syndrome buffer. That is, it is determined whether or not all of the second syndrome values are '0' or whether or not the flash memory system correctly error-corrects the BCH codeword to generate the error-corrected BCH codeword through the second syndrome operation.

When all of the second syndrome values are '0' and thus the error-corrected BCH codeword does not include any error as the result of the determination of step S719 ("Y"), the flash memory system may change the values of the first syndrome buffer from the first syndrome values to '0' at step S721. The error-corrected BCH codeword may be determined as including no error or the error-corrected BCH codeword may be determined as being correctly error-corrected through the second syndrome values, and thus the flash memory system may change the values of the first syndrome buffer from the first syndrome values to '0'.

For the change of the values of the first syndrome buffer from the first syndrome values to '0', the flash memory system may change the values of '1' in the first syndrome values to the value '0', or may store the second syndrome values into the first syndrome buffer.

At step S725, the flash memory system may transfer the error-corrected BCH codeword and the success flag to the host when all of the second syndrome values are '0' and thus the error-corrected BCH codeword does not include any error.

However, when one or more of the second syndrome values are not '0' and thus the error-corrected BCH codeword includes one or more errors as the result of the determination of step S719 ("N"), the flash memory system may perform a second bit-flip operation to the bit values of the bits corresponding to the locations of errors obtained from the error-corrected BCH codeword by the Chien search algorithm at step S723. The flash memory system may restore the error-corrected BCH codeword to the BCH codeword, which is used for the first syndrome operation of step S701, by re-flipping the bit values corresponding to the locations of errors obtained at step S709, in the error-corrected BCH codeword. The flash memory system may output a restored BCH codeword, which is the BCH codeword restored from the error-corrected BCH codeword. The flash memory system may output the restored BCH codeword since the error-corrected BCH codeword, which is not correctly error-corrected, may have more errors than the original BCH codeword.

At step S727, the flash memory system may transfer the restored BCH codeword and a failure flag to the host when one or more of the second syndrome values are not '0' and thus the error-corrected BCH codeword includes one or more errors.

Figure 8:
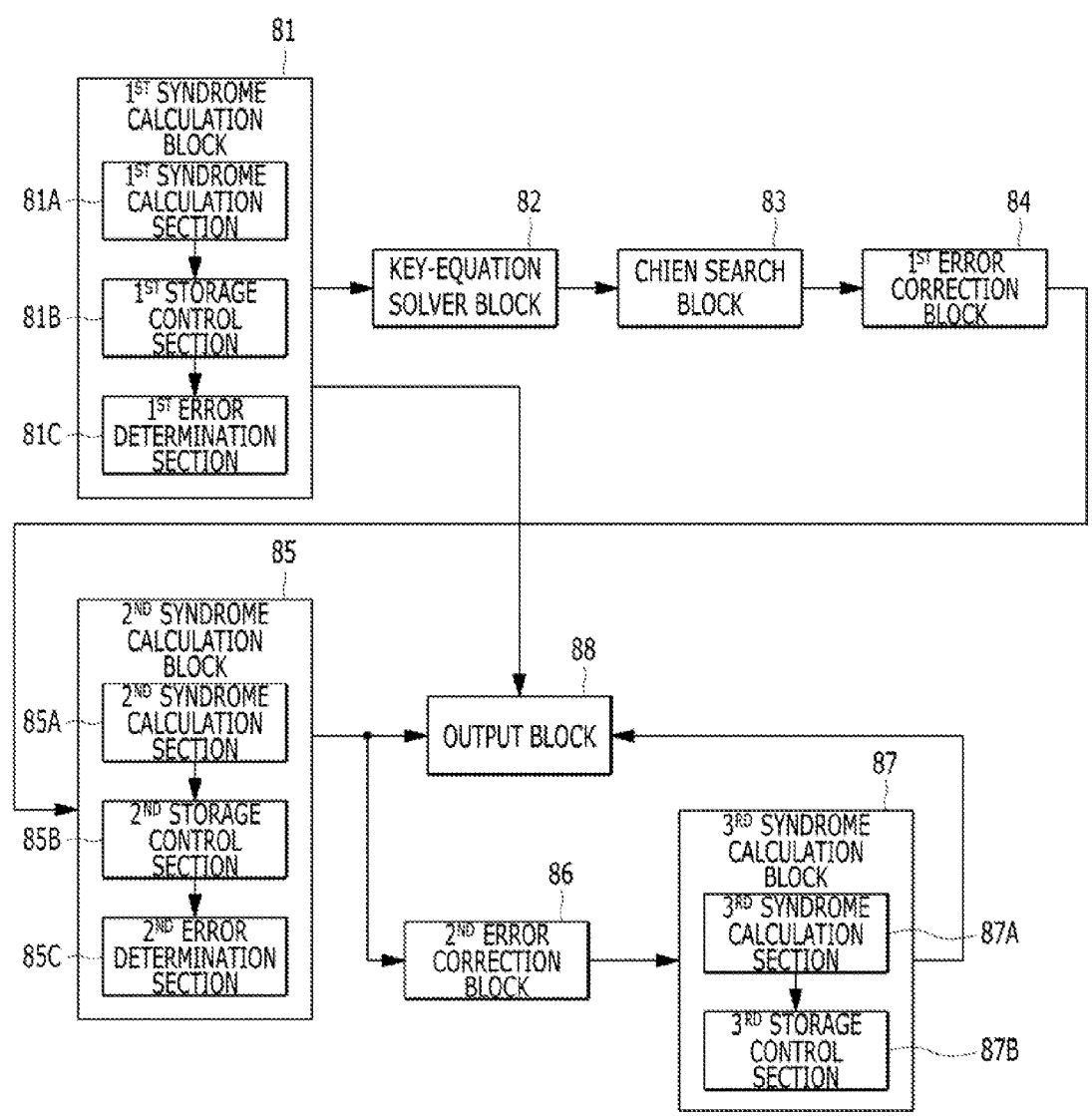
FIG. 8 is a block diagram illustrating an error correction code decoder in accordance with a third embodiment of the present invention.

FIG. 8 is a block diagram Illustrating an error correction code decoder in accordance with a third embodiment of the present invention. Referring to FIG. 8, the third embodiment of the present invention may be an error correction code decoder. FIG. 8 shows a decoder of the Bose-Chadhuri-Hocquenghem (BCH) code included in the concatenated BCH code. The error correction code decoder may use the concatenated BCH code, the hamming code, and the Reed-Solomon code.

As described below, first to third storage control sections 81B, 85B and 87B may store syndrome values outputted from a single syndrome buffer through an overwrite operation.

Referring to FIG. 8, the error correction code decoder may include a first syndrome calculation block 81, a key-equation solver block 82, a chien search block 83, a first error correction block 84, a second syndrome calculation block 85, a second error correction block 86, a third syndrome calculation block 87 and an output block 88.

The first syndrome calculation block 81 may include a first syndrome calculation section 81A, the first storage control section 81B, and a first error determination section 81C. The first syndrome calculation section 81A may receive a BCH codeword from the non-volatile memory device 200. (shown in FIG. 2) The first syndrome calculation section 81A may calculate first syndrome values from the BCH codeword, and may provide the first syndrome values to the first storage control section 81B.

The first storage control section 81B may store the first syndrome values, which are calculated by the first syndrome calculation section 81A, to a syndrome buffer. The first error determination section 81C may determine whether or not the BCH codeword has an error through the first syndrome values stored in the syndrome buffer.

When all of the first syndrome values are '0' and thus the BCH codeword does not include any error as the result of the determination, the first error determination section 81C may provide the BCH codeword and a success flag to the output block 88 in order to provide the BCH codeword and the success flag to the host.

When one or more of the first syndrome values are not '0' and thus the BCH codeword includes one or more errors as the result of the determination, the first error determination section 81C may provide the first syndrome values to the key-equation solver block 82 in order to error-correct the BCH codeword.

The key-equation solver block 82 may generate the error location polynomial (ELP) based on the first syndrome values in order to solve the key-equation. The key-equation solver block 82 may use the Berleykamp-Massey (BM) algorithm or the Euclidian algorithm. For example, the key-equation solver block 82 may generate the ELP based on the first syndrome values through the BM algorithm. The key-equation solver block 82 may provide the ELP to the chien search block 83.

The chien search block 83, using the Chien search algorithm, may calculate locations of errors and the number of the locations of errors in the BCH codeword through the ELP generated by the key-equation solver block 82.

The first error correction block 84 may error-correct error bits of the BCH codeword corresponding to the locations of errors. The first error correction block 84 may error-correct the BCH codeword by flipping bit values of the error bits of the BCH codeword, and may output an error-corrected BCH codeword. The first error correction block 84 may provide the error-corrected BCH codeword to the second syndrome calculation block 85.

The second syndrome calculation block 85 may include a second syndrome calculation section 85A, a second storage control section 85B, and a second error determination section 85C. The second syndrome calculation section 85A may perform a second syndrome operation by calculating second syndrome values from the error-corrected BCH codeword, and may provide the second syndrome values to the second storage control section 85B. Through the second syndrome operation with the error-corrected BCH codeword provided from the first error correction block 84, the BCH codeword provided from the non-volatile memory device 200 may be determined to be correctly error-corrected or not.

The second storage control section 85B may store the second syndrome values, which are calculated by the second syndrome calculation section 85A, to the syndrome buffer. The second storage control section 85B may overwrite the first syndrome values stored in the syndrome buffer for storing the second syndrome values in the syndrome buffer.

The second error determination section 85C may determine whether or not the error-corrected BCH codeword has an error through the second syndrome values stored in the syndrome buffer. That is, through the second syndrome operation with the error-corrected BCH codeword provided from the first error correction block 84, the BCH codeword provided from the non-volatile memory device 200 may be determined to be correctly error-corrected or not.

When all of the second syndrome values are '0' and thus the error-corrected BCH codeword does not include any error as the result of the determination, the second error determination section 85C may provide the error-corrected BCH codeword and a success flag to the output block 88.

When one or more of the second syndrome values are not '0' and thus the error-corrected BCH codeword includes one or more errors as the result of the determination, the second error determination section 85C may provide the error-corrected BCH codeword to the second error correction block 86 in order to restore the error-corrected BCH codeword to the BCH codeword, which is provided to the first syndrome calculation block 81.

The second error correction block 86 may restore the error-corrected BCH codeword, which is provided from the second error determination section 85C, to the BCH codeword, which is provided from the non-volatile memory device 200 to the first syndrome calculation block 81, by re-flipping the bit values, which have been previously flipped by the first error correction block 84, in the error-corrected BCH codeword. The second error correction block 86 may output a restored BCH codeword, which is the BCH codeword restored from the error-corrected BCH codeword. The second error correction block 86 may output the restored BCH codeword since the error-corrected BCH codeword, which is not correctly error-corrected, may have more errors than the original BCH codeword.

The third syndrome calculation block 87 may include a third syndrome calculation section 87A and the third storage control section 87B.

The third syndrome calculation section 87A may perform a third syndrome operation by calculating third syndrome values from the restored BCH codeword. The third syndrome calculation section 87A may perform the third syndrome operation in order to restore the second syndrome values for the error-corrected BCH codeword to the first syndrome values for the original BCH codeword since the error-corrected BCH codeword is restored to the original BCH codeword. The third syndrome values may be the same as the first syndrome values, which is calculated by the first syndrome calculation section 81A, and thus is referred to as a restored first syndrome values hereinafter.

The third storage control section 87B may store the third syndrome values or the restored first syndrome values in the syndrome buffer by overwriting the second syndrome values stored in the syndrome buffer.

The output block 88 may transfer the BCH codeword and the success flag from the first syndrome calculation block 81 to the host when all of the first syndrome values are '0' and thus the BCH codeword does not include any error. Additionally, the output block 88 may transfer the error-corrected BCH codeword and the success flag from the second syndrome calculation block 85 to the host when all of the second syndrome values are '0' and thus the error-corrected BCH codeword does not include any error.

However, the output block 88 may transfer the restored BCH codeword and a failure flag to the host when one or more of the second syndrome values are not '0' and thus the error-corrected BCH codeword includes one or more errors.

Figure 9:
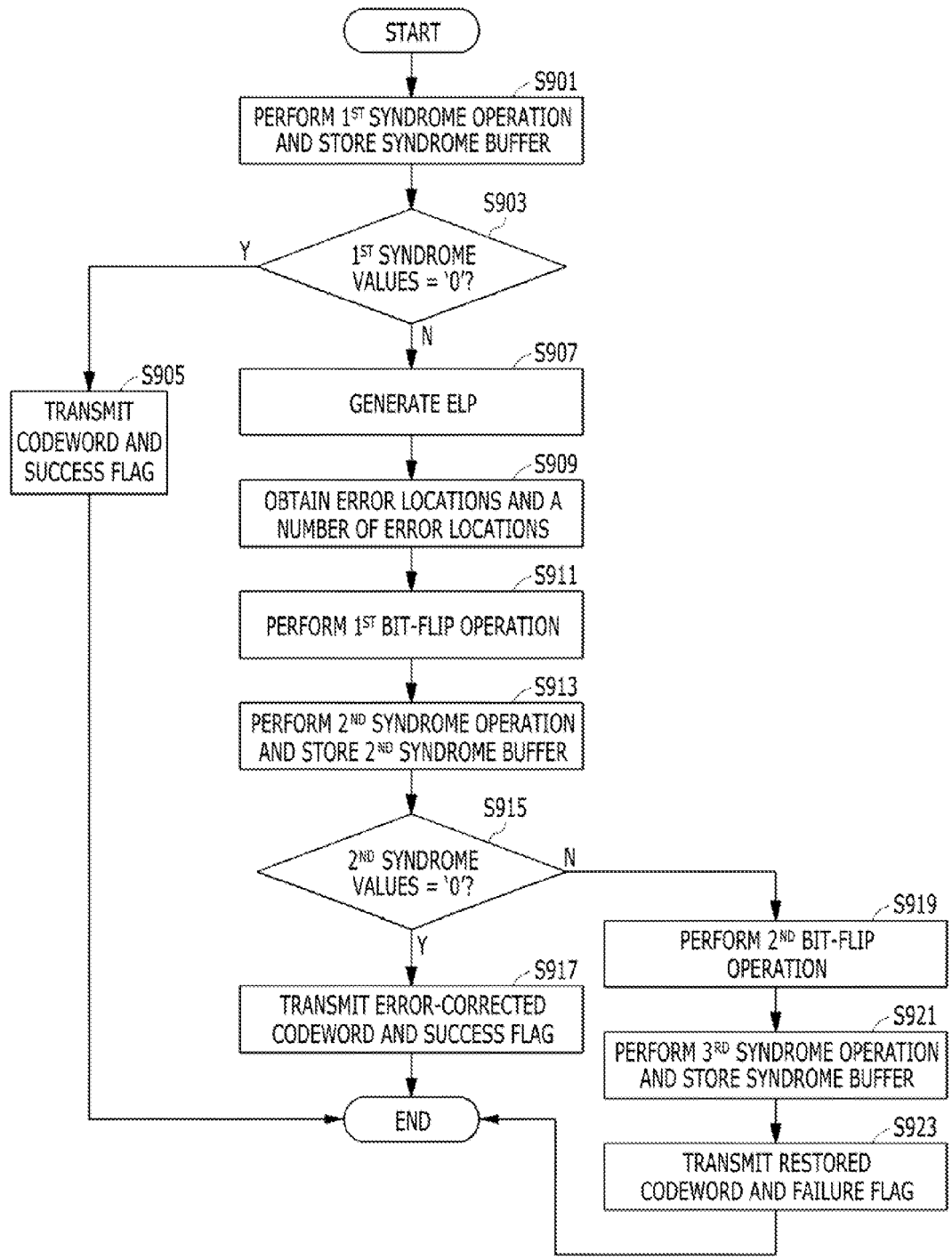
FIG. 9 is a flowchart illustrating an operation of a flash memory system in accordance with the third embodiment of the present invention.

FIG. 9 is a flowchart illustrating an operation of a flash memory system in accordance with a third embodiment of the present invention. The flash memory system may receive a BCH codeword from the non-volatile memory device 200.

Referring to FIG. 9, at step S901, the flash memory system may perform a first syndrome operation by calculating first syndrome values from the BCH codeword. The flash memory system may store the first syndrome values to a syndrome buffer.

At step S903, the flash memory system may determine whether or not the BCH codeword has an error through the first syndrome values stored in the syndrome buffer.

When all of the first syndrome values are '0' and thus the BCH codeword does not include any error as the result of the determination of step S903 ("Y"), the BCH codeword may not need the error correction and thus the flash memory system may provide the BCH codeword and a success flag to the host at step S905.

When one or more of the first syndrome values are not '0' and thus the BCH codeword includes one or more errors as the result of the determination of step S903 ("N"), the flash memory system may generate the error location polynomial (ELP) based on the first syndrome values in order to error-correct the BCH codeword at step S907. The flash memory system may generate the ELP through the key-equation solver. The key-equation solver may use the Berleykamp-Massey (BM) algorithm or the Euclidian algorithm. For example, the key-equation solver may generate the ELP based on the first syndrome values through the BM algorithm.

At step S909, the flash memory system may calculate locations of errors and the number of the locations of errors in the BCH codeword through the ELP. The flash memory system may use the Chien search algorithm, and may generate an error polynomial. Coefficients of the error polynomial may represent the locations of the error bits.

At step S911, the flash memory system may perform a first bit-flip operation in order to error-correct the error bits of the BCH codeword corresponding to the locations of errors. The flash memory system may error-correct the BCH codeword by flipping bit values of the error bits of the BCH codeword corresponding to the locations of errors, and may output an error-corrected BCH codeword.

At step S913, the flash memory system may perform a second syndrome operation by calculating second syndrome values from the error-corrected BCH codeword. Through the second syndrome operation with the error-corrected BCH codeword, the BCH codeword provided from the non-volatile memory device 200 may be determined as being correctly error-corrected or not. The flash memory system may store the second syndrome values to the syndrome buffer. The flash memory system may store the second syndrome values in the syndrome buffer by overwriting the first syndrome values stored in the syndrome buffer.

At step S915, the flash memory system may determine whether or not the error-corrected BCH codeword has an error through the second syndrome values stored in the syndrome buffer. That is, it is determined whether or not all of the second syndrome values are '0' or whether or not the flash memory system correctly error-corrects the BCH codeword to generate the error-corrected BCH codeword through the second syndrome operation.

When all of the second syndrome values are '0' and thus the error-corrected BCH codeword does not include any error as the result of the determination of step S915 ("Y"), the flash memory system may transfer the error-corrected BCH codeword and the success flag to the host at step S917.

However, when one or more of the second syndrome values are not '0' and thus the error-corrected BCH codeword includes one or more errors as the result of the determination of step S915 ("N"), the flash memory system may perform a second bit-flip operation to the bit values of the bits corresponding to the locations of errors obtained from the error-corrected BCH codeword by the Chien search algorithm at step S919. The flash memory system may restore the error-corrected BCH codeword to the BCH codeword, which is used for the first syndrome operation of step S901, by re-flipping the bit values corresponding to the locations of errors obtained at step S909, in the error-corrected BCH codeword. The flash memory system may output a restored BCH codeword, which is the BCH codeword restored from the error-corrected BCH codeword. The flash memory system may output the restored BCH codeword since the error-corrected BCH codeword, which is not correctly error-corrected, may have more errors than the original BCH codeword.

At step S921, the flash memory system may perform a third syndrome operation by calculating third syndrome values from the restored BCH codeword. The flash memory system may perform the third syndrome operation in order to restore the second syndrome values for the error-corrected BCH codeword to the first syndrome values for the original BCH codeword since the error-corrected BCH codeword is restored to the original BCH codeword. The third syndrome values may be the same as the first syndrome values, which are calculated by the first syndrome calculation section 81A, and thus is referred to as the restored first syndrome values hereinafter. The flash memory system may store the third syndrome values or the restored first syndrome values in the syndrome buffer by overwriting the second syndrome values stored in the syndrome buffer.

At step S923, the flash memory system may transfer the restored BCH codeword and a failure flag to the host when one or more of the second syndrome values are not '0' and thus the error-corrected BCH codeword includes one or more errors.

Figure 10:
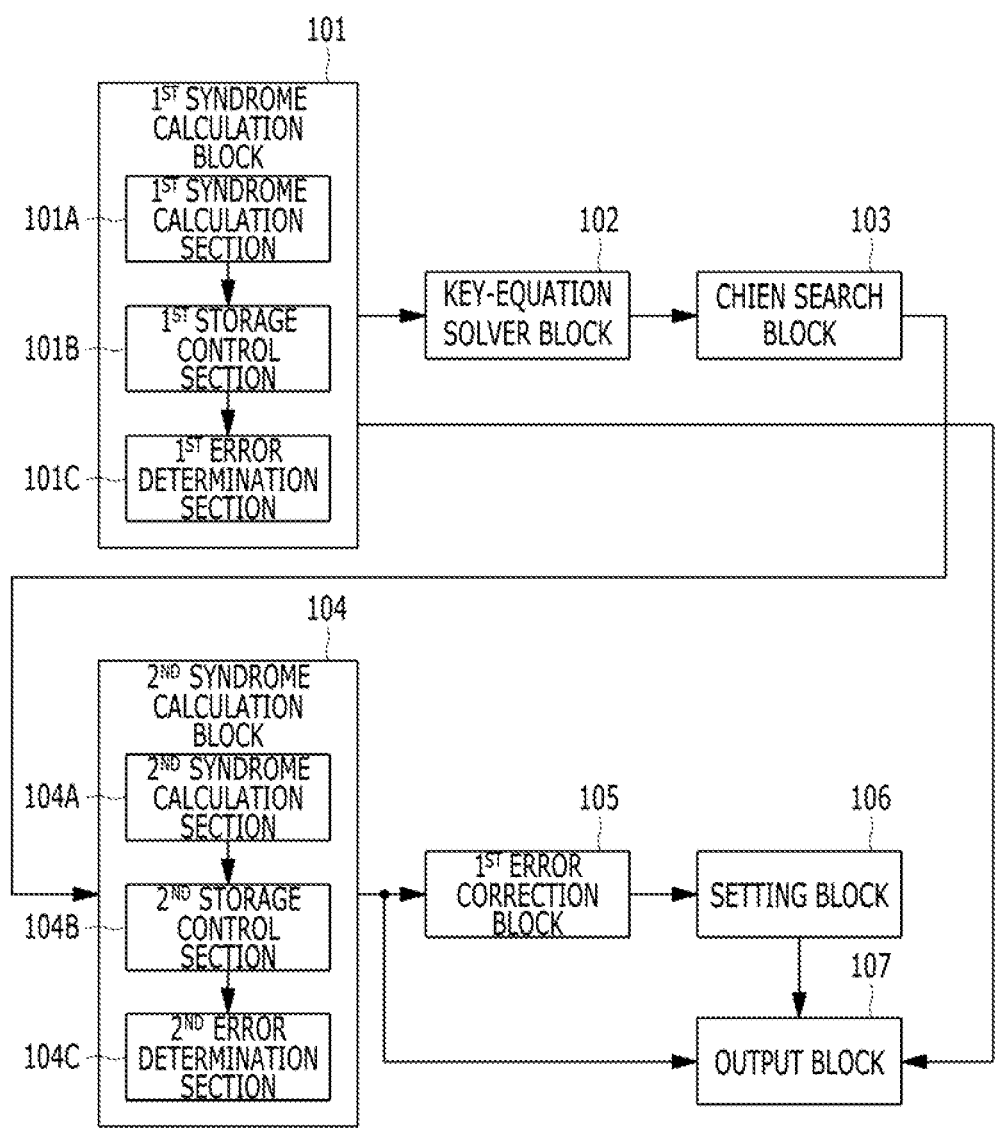
FIG. 10 is a block diagram illustrating an error correction code decoder in accordance with a fourth embodiment of the present invention.

FIG. 10 is a block diagram illustrating an error correction code decoder in accordance with a fourth embodiment of the present invention. Referring to FIG. 10, the fourth embodiment of the present invention may be an error correction code decoder. FIG. 10 shows a decoder of the Bose-Chadhuri-Hocquenghem (BCH) code included in the concatenated BCH code. The error correction code decoder may use the concatenated BCH code, the hamming code, and the Reed-Solomon code.

Referring to FIG. 10, the error correction code decoder may include a first syndrome calculation block 101, a key-equation solver block 102, a chien search block 103, a second syndrome calculation block 104, a setting block 106, and an output block 107.

The first syndrome calculation block 101 may include a first syndrome calculation section 101A, a first storage control section 101B, and a first error determination section 101C. The first syndrome calculation section 101A may receive a BCH codeword from the non-volatile memory device 200. The first syndrome calculation section 101 may calculate first syndrome values from the BCH codeword, and may provide the first syndrome values to the first storage control section 101B.

The first storage control section 101B may store the first syndrome values, which are calculated by the first syndrome calculation section 101A, to a first syndrome buffer. The first error determination section 101C may determine whether or not the BCH codeword has an error through the first syndrome values stored in the first syndrome buffer.

When all of the first syndrome values are '0' and thus the BCH codeword does not include any error as the result of the determination, the first error determination section 101C may provide the BCH codeword and a success flag to the output block 107 in order to provide the BCH codeword and the success flag to the host.

When one or more of the first syndrome values are not '0' and thus the BCH codeword includes one or more errors as the result of the determination, the first error determination section 101C may provide the first syndrome values to the key-equation solver block 102 in order to error-correct the BCH codeword.

The key-equation solver block 102 may generate the error location polynomial (ELP) based on the first syndrome values in order to solve the key-equation. The key-equation solver block 102 may use the Berleykamp-Massey (BM) algorithm or the Euclidean algorithm. For example, the key-equation solver block 102 may generate the ELP based on the first syndrome values through the BM algorithm. The key-equation solver block 102 may provide the ELP to the chien search block 103.

The chien search block 103, using the Chien search algorithm, may calculate locations of errors and the number of the locations of errors in the BCH codeword through the ELP generated by the key-equation solver block 102.

The second syndrome calculation block 104 may include a second syndrome calculation section 104A, a second storage control section 1046, and a second error determination section 104C. The second syndrome calculation section 104A may perform a second syndrome operation by calculating second syndrome values from the BCH codeword, and may provide the second syndrome values to the second storage control section 104B. Through the second syndrome operation with the BCH codeword provided from the chien search block 103, the BCH codeword provided from the non-volatile memory device 200 may be determined as being error-correctable or not.

The second storage control section 104B may store the second syndrome values, which are calculated by the second syndrome calculation section 104A, to a second syndrome buffer.

The second error determination section 104C may determine whether or not the BCH codeword is error-correctable through the second syndrome values stored in the second syndrome buffer.

When one or more of the second syndrome values are not '0' as the result of the determination, the second error determination section 104C may provide the BCH codeword, the error-correction of which fails, and a failure flag to the output block 107 without the error-correction to the BCH codeword.

When all of the second syndrome values are '0' as the result of the determination, the second error determination section 45C may provide the second syndrome values to the first error correction block 105 in order to error-correct the BCH codeword.

The first error correction block 105 may error-correct error bits of the BCH codeword corresponding to the locations of errors, which is obtained by the chien search block 103. The first error correction block 105 may error-correct the BCH codeword by flipping bit values of the error bits of the BCH codeword, and may output an error-corrected BCH codeword. The first error correction block 105 may provide the error-corrected BCH codeword to the setting block 106.

The setting block 106 may change the values of the first syndrome buffer from the first syndrome values to '0'.

For the change of the values of the first syndrome buffer from the first syndrome values to '0', the setting block 106 may change the values of '1' in the first syndrome values to the value '0', or may store the second syndrome values, which are generated by the second syndrome calculation block 104, into the first syndrome buffer.

The output block 107 may transfer the BCH codeword and the success flag from the first syndrome calculation block 101 to the host when all of the first syndrome values are '0' and thus the BCH codeword does not include any error.

Additionally, the output block 107 may transfer the error-corrected BCH codeword and the success flag from the first syndrome calculation block 101 to the host.

Furthermore, the output block 107 may transfer the BCH codeword and a failure flag from the second syndrome calculation block 104 to the host.

Figure 11:
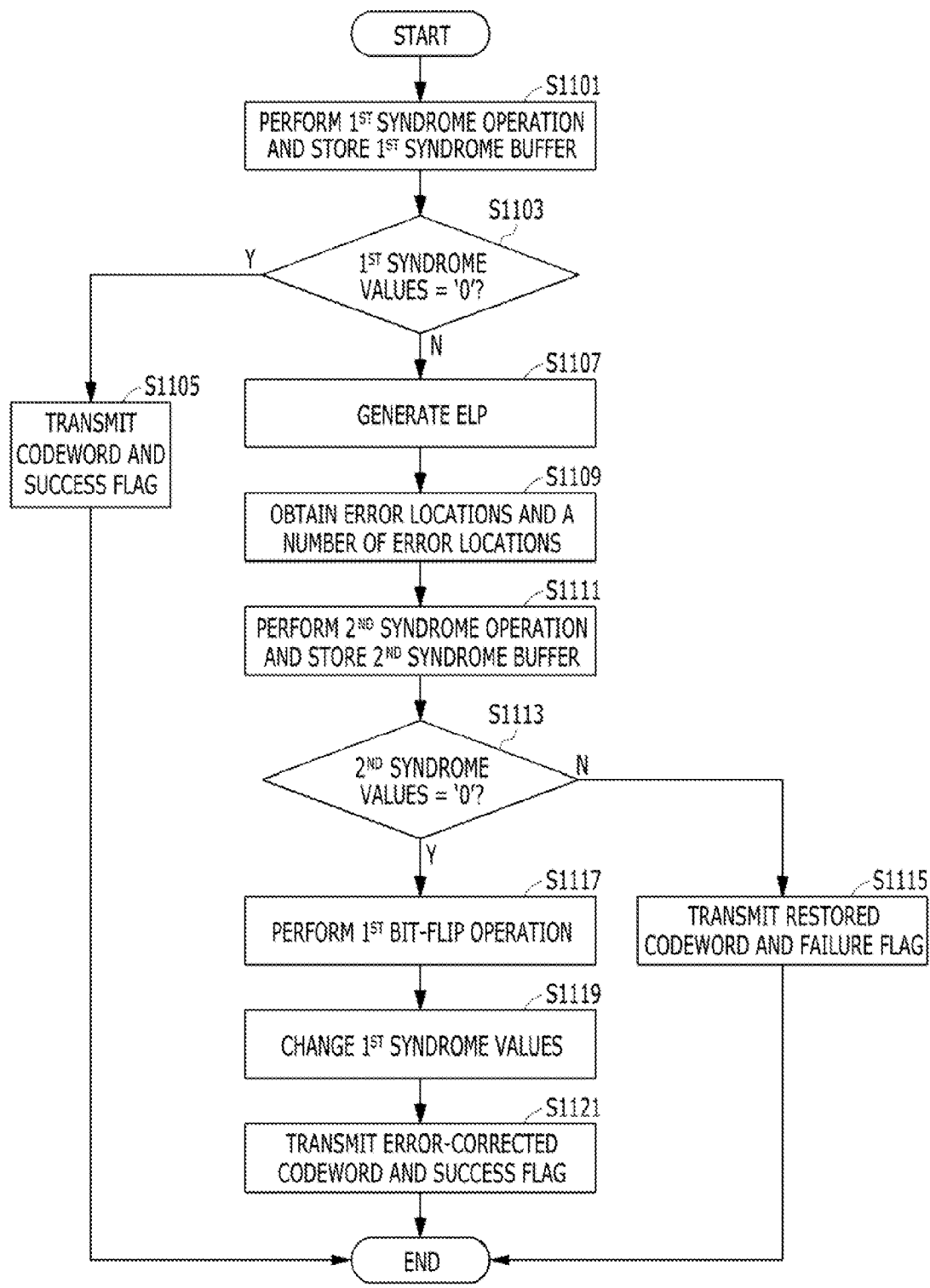
FIG. 11 is a flowchart illustrating an operation of a flash memory system in accordance with the fourth embodiment of the present invention.

FIG. 11 is a flowchart illustrating an operation of a flash memory system in accordance with the fourth embodiment of the present invention. The flash memory system may receive a BCH codeword from the non-volatile memory device 200.

Referring to FIG. 11, at step S1101, the flash memory system may perform a first syndrome operation by calculating first syndrome values from the BCH codeword. The flash memory system may store the first syndrome values to a first syndrome buffer.

At step S1103, the flash memory system may determine whether or not the BCH codeword has an error through the first syndrome values stored in the first syndrome buffer.

When all of the first syndrome values are '0' and thus the BCH codeword does not include any error as the result of the determination of step S1103 ("Y"), the BCH codeword may not need the error correction and thus the flash memory system may provide the BCH codeword and a success flag to the host at step S1105.

When one or more of the first syndrome values are not '0' and thus the BCH codeword includes one or more errors as the result of the determination of step S1103 ("N"), the flash memory system may generate the error location polynomial (ELP) based on the first syndrome values in order to error-correct the BCH codeword at step S1107. The flash memory system may generate the ELP through the key-equation solver. The key-equation solver may use the Berleykamp-Massey (BM) algorithm or the Euclidian algorithm. For example, the key-equation solver may generate the ELP based on the first syndrome values through the BM algorithm.

At step S1109, the flash memory system may calculate locations of errors and the number of the locations of errors in the BCH codeword through the ELP. The flash memory system may use the Chien search algorithm, and may generate an error polynomial. Coefficients of the error polynomial may represent the locations of the error bits.

At step S1111, the flash memory system may perform a second syndrome operation by calculating second syndrome values from the BCH codeword. Through the second syndrome operation with the BCH codeword of step S1109, the BCH codeword provided from the non-volatile memory device 200 may be determined to be error-correctable or not. The flash memory system may store the second syndrome values to a second syndrome buffer.

At step S1113, the flash memory system may determine whether or not the BCH codeword is error-correctable through the second syndrome values stored in the second syndrome buffer.

When one or more of the second syndrome values are not '0' as the result of the determination at step S1113 ("N"), the flash memory system may determine that the BCH codeword is not error-correctable and may provide the BCH codeword, the error-correction of which fails, and a failure flag to the host at step S1115.

When all of the second syndrome values are '0' as the result of the determination at step S1113 ("Y"), the flash memory system at step S1117 may determine that the BCH codeword is error-correctable and may error-correct error bits of the BCH codeword corresponding to the locations of errors, which is obtained at step S1109. The flash memory system may error-correct the BCH codeword by flipping bit values of the error bits of the BCH codeword, and may output an error-corrected BCH codeword.

At step S1119, the flash memory system may change the values of the first syndrome buffer from the first syndrome values to '0'. For the change of the values of the first syndrome buffer from the first syndrome values to '0', the flash memory system may change the values of '1' in the first syndrome values to the value '0', or may store the second syndrome values into the first syndrome buffer.

At step S1121, the flash memory system may transfer the error-corrected BCH codeword and the success flag to the host when all of the second syndrome values are '0' and thus the error-corrected BCH codeword does not include any error.

Figure 12:
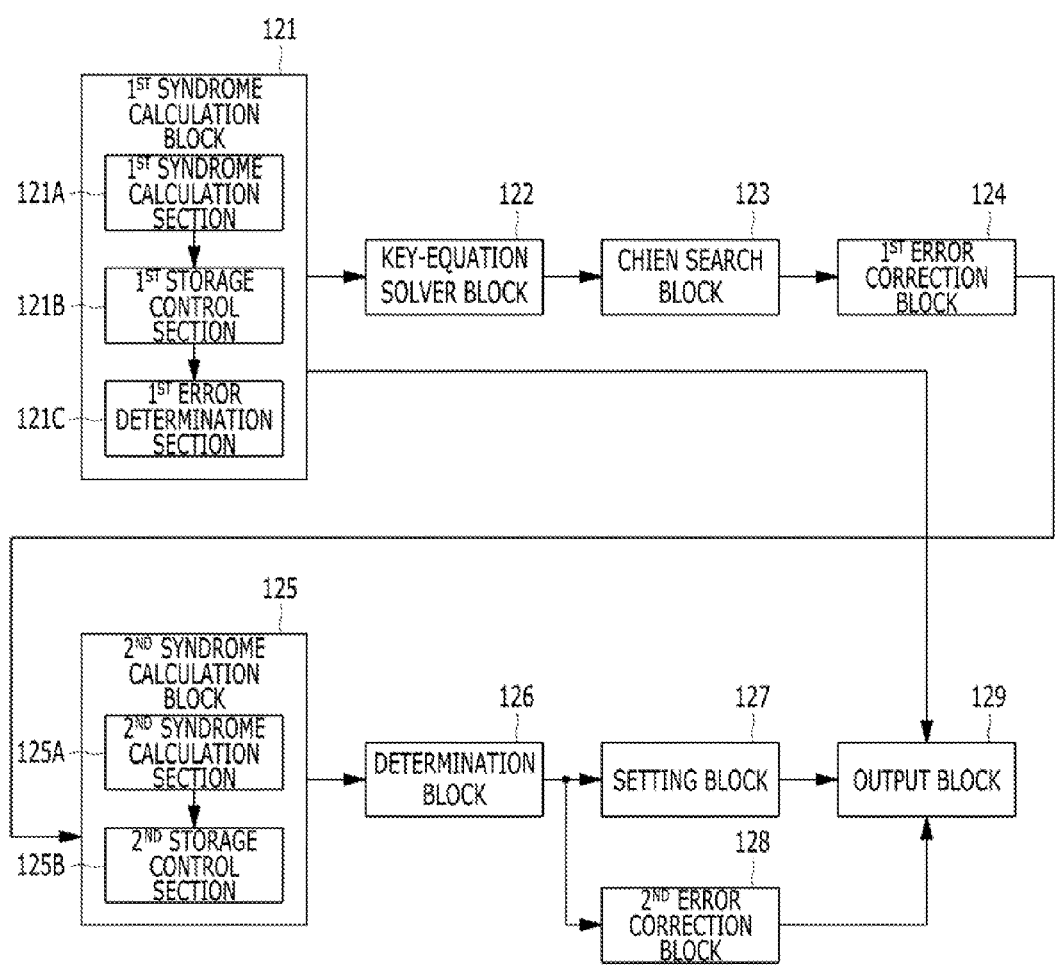
FIG. 12 is a block diagram illustrating an error correction code decoder in accordance with a fifth embodiment of the present invention.

FIG. 12 is a block diagram illustrating an error correction code decoder in accordance with a fifth embodiment of the present invention.

Referring to FIG. 12, the fifth embodiment of the present invention may be an error correction code decoder. FIG. 12 shows a decoder of the Bose-Chadhuri-Hocquenghem (BCH) code included in the concatenated BCH code. The error correction code decoder may use the concatenated BCH code, the hamming code, and the Reed-Solomon code.

Referring to FIG. 12, the error correction code decoder may include a first syndrome calculation block 121, a key-equation solver block 102, a chien search block 123, a first error correction block 124, a second syndrome calculation block 125, a determination block 126, a setting block 127, a second error correction block 128, and an output block 129.

The first syndrome calculation block 121 may include a first syndrome calculation section 121A, a first storage control section 121B, and a first error determination section 121C. The first syndrome calculation section 121A may receive a BCH codeword from the non-volatile memory device 200.

The first syndrome calculation section 121 may calculate first syndrome values from the BCH codeword, and may provide the first syndrome values to the first storage control section 121B. The first storage control section 121B may store the first syndrome values, which are calculated by the first syndrome calculation section 121A, to a first syndrome buffer.

The first error determination section 121C may determine whether or not the BCH codeword has an error through the first syndrome values stored in the first syndrome buffer.

When all of the first syndrome values are '0' and thus the BCH codeword does not include any error as the result of the determination, the first error determination section 121C may provide the BCH codeword and a success flag to the output block 129 in order to provide the BCH codeword and the success flag to the host.

When one or more of the first syndrome values are not '0' and thus the BCH codeword includes one or more errors as the result of the determination, the first error determination section 121C may provide the first syndrome values to the key-equation solver block 102 in order to error-correct the BCH codeword.

The key-equation solver block 122 may generate the error location polynomial (ELP) based on the first syndrome values in order to solve the key-equation. The key-equation solver block 122 may use the Berleykamp-Massey (BM) algorithm or the Euclidian algorithm. For example, the key-equation solver block 122 may generate the ELP based on the first syndrome values through the BM algorithm. The key-equation solver block 122 may provide the ELP to the chien search block 123.

The chien search block 123, using the Chien search algorithm, may calculate locations of errors in the BCH codeword through the ELP generated by the key-equation solver block 122.

The first error correction block 124 may error-correct error bits of the BCH codeword corresponding to the locations of errors. The first error correction block 124 may error-correct the BCH codeword by flipping bit values of the error bits of the BCH codeword, and may output an error-corrected BCH codeword. The first error correction block 124 may error-correct the BCH codeword by performing XOR operation to the bit values of the error bits of the BCH codeword and error-correction bit values, which are used for error-correction of the error bits of the BCH codeword. The first error correction block 124 may provide the error-corrected BCH codeword to the second syndrome calculation block 125.

The second syndrome calculation block 125 may include a second syndrome calculation section 125A, and a second storage control section 125B.

The second syndrome calculation section 125A may perform a second syndrome operation by calculating second syndrome values from the error-correction bit values, and may provide the second syndrome values to the second storage control section 125B.

The second storage control section 125B may store the second syndrome values, which are calculated by the second syndrome calculation section 125A, to a second syndrome buffer.

The determination block 126 may determine whether or not the first syndrome values and the second syndrome values are the same as each other. Through the determination of whether or not the first syndrome values and the second syndrome values are the same as each other, it is determined whether or not the error-correction bit values may be correct.

When the first syndrome values and the second syndrome values are the same as each other, the determination block 126 may provide the second syndrome values to the setting block 127.

When the first syndrome values and the second syndrome values are not the same as each other, the determination block 126 may provide the error-corrected BCH codeword to the second error correction block 128.

The setting block 127 may change the values of the first syndrome buffer from the first syndrome values to '0'. When the determination block 126 provides the second syndrome values to the setting block 127, the second syndrome values may be determined to be correct and thus the setting block 127 may change the values of the first syndrome buffer from the first syndrome values to '0'.

For the change of the values of the first syndrome buffer from the first syndrome values to '0', the setting block 127 may change the values of '1' in the first syndrome values to the value '0', or may store the second syndrome values, which are generated by the second syndrome calculation block 125, into the first syndrome buffer.

The second error correction block 128 may restore the error-corrected BCH codeword, which is provided from the determination block 126, to the BCH codeword, which is provided from the non-volatile memory device 200 to the first syndrome calculation block 121, by re-flipping the bit values, which have been previously flipped by the first error correction block 124, in the error-corrected BCH codeword. The second error correction block 128 may output a restored BCH codeword, which is the BCH codeword restored from the error-corrected BCH codeword. The second error correction block 128 may output the restored BCH codeword since the error-corrected BCH codeword, which is not correctly error-corrected, may have more errors than the original BCH codeword.

The output block 129 may transfer the BCH codeword and the success flag from the first syndrome calculation block 121 to the host when all of the first syndrome values are '0' and thus the BCH codeword does not include any error.

Also, the output block 129 may transfer the error-corrected BCH codeword and the success flag from the second syndrome calculation block 125 to the host when the first syndrome values and the second syndrome values are the same as each other.

However, the output block 129 may transfer the restored BCH codeword and a failure flag from the second error correction block 128 to the host when the first syndrome values and the second syndrome values are not the same as each other.

Figure 13:
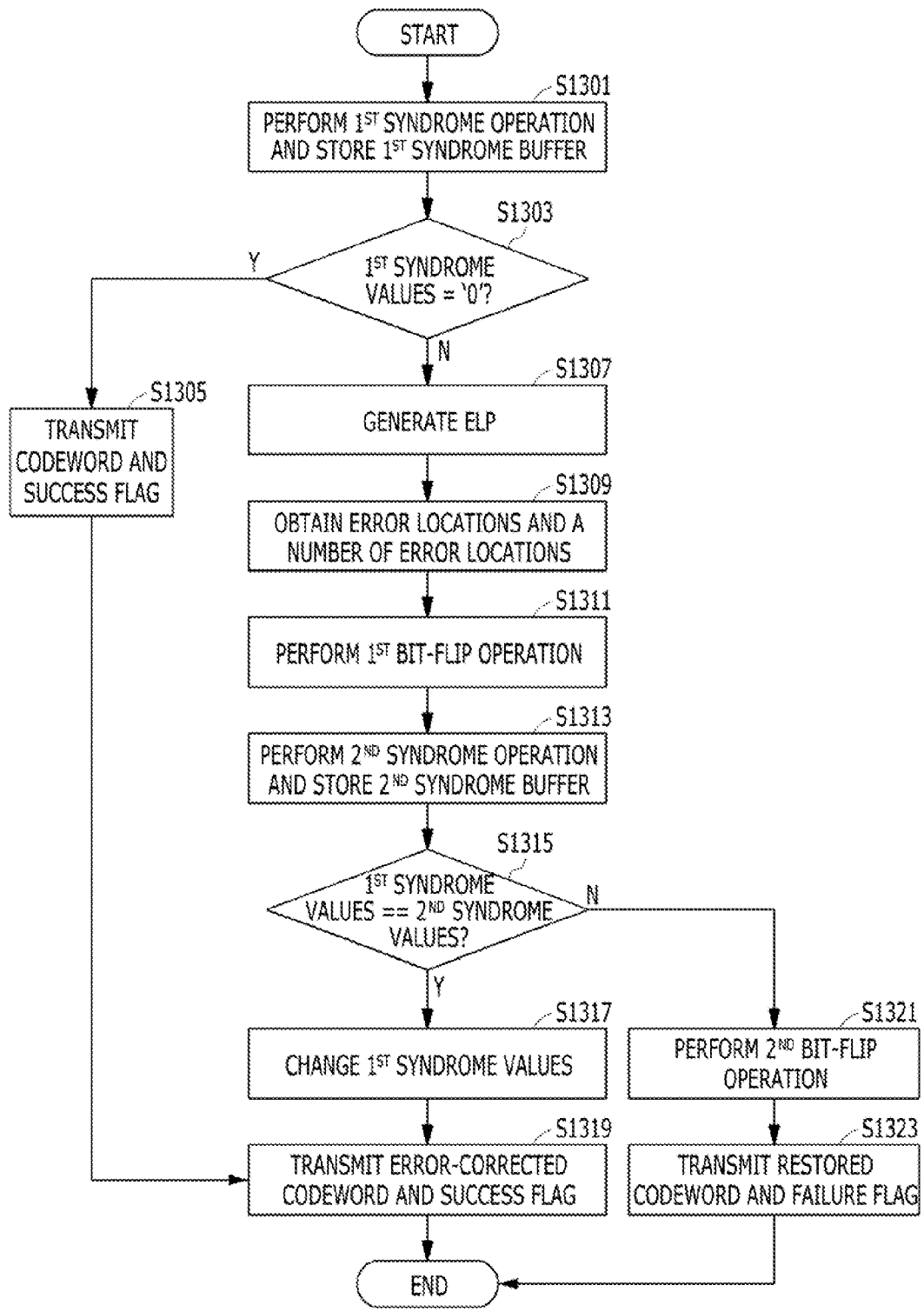
FIG. 13 is a flowchart illustrating an operation of a flash memory system in accordance with the fifth embodiment of the present invention.

FIG. 13 is a flowchart illustrating an operation of a flash memory system in accordance with the fifth embodiment of the present invention.

The flash memory system may receive a BCH codeword from the non-volatile memory device 200.

Referring to FIG. 13, at step S1301, the flash memory system may perform a first syndrome operation by calculating first syndrome values from the BCH codeword. The flash memory system may store the first syndrome values to a first syndrome buffer.

At step S1303, the flash memory system may determine whether or not the BCH codeword has an error through the first syndrome values stored in the first syndrome buffer.

When all of the first syndrome values are '0' and thus the BCH codeword does not include any error as the result of the determination of step S1303 ("Y"), the BCH codeword may not need the error correction and thus the flash memory system may provide the BCH codeword and a success flag to the host at step S1305.

When one or more of the first syndrome values are not '0' and thus the BCH codeword includes one or more errors as the result of the determination of step S1303 ("N"), the flash memory system may generate the error location polynomial (ELP) based on the first syndrome values in order to error-correct the BCH codeword at step S1307. The flash memory system may generate the ELP through the key-equation solver. The key-equation solver may use the Berleykamp-Massey (BM) algorithm or the Euclidian algorithm. For example, the key-equation solver may generate the ELP based on the first syndrome values through the BM algorithm.

At step S1309, the flash memory system may calculate locations of errors and the number of the locations of errors in the BCH codeword through the ELP. The flash memory system may use the Chien search algorithm, and may generate an error polynomial. Coefficients of the error polynomial may represent the locations of the error bits.

At step S1311, the flash memory system may perform a first bit-flip operation in order to error-correct the error bits of the BCH codeword corresponding to the locations of errors. The flash memory system may error-correct the BCH codeword by performing XOR operation to the bit values of the error bits of the BCH codeword and error-correction bit values, which are used for error-correction of the error bits of the BCH codeword, and may output an error-corrected BCH codeword.

At step S1313, the flash memory system may perform a second syndrome operation by calculating second syndrome values from the error-correction bit values. The flash memory system may store the second syndrome values to a second syndrome buffer.

Through the second syndrome operation with the error-correction bit values, it is determined whether or not the error-correction bit values are correct at step S1315.

At step S1315, the flash memory system may determine whether or not the first syndrome values and the second syndrome values are the same as each other. Through the determination of whether or not the first syndrome values and the second syndrome values are the same as each other, it is determined whether or not the error-correction bit values are correct.

When the first syndrome values and the second syndrome values are the same as each other as the result of the determination of step S1315 ("Y"), the error-correction bit values may be determined as being correct and thus the flash memory system may change the values of the first syndrome buffer from the first syndrome values to '0' at step S1317.

For the change of the values of the first syndrome buffer from the first syndrome values to '0', the flash memory system may change the values of '1' in the first syndrome values to the value '0', or may store the second syndrome values into the first syndrome buffer.

At step S1319, the flash memory system may transfer the error-corrected BCH codeword and the success flag to the host when the first syndrome values and the second syndrome values are the same as each other.

However, when the first syndrome values and the second syndrome values are not the same as each other as the result of the determination of step S1315 ("N"), the flash memory system may perform a second bit-flip operation to the bit values of the bits corresponding to the locations of errors obtained from the error-corrected BCH codeword by the Chien search algorithm at step S1321. The flash memory system may restore the error-corrected BCH codeword to the BCH codeword, which is used for the first syndrome operation of step S1301, by re-flipping the bit values corresponding to the locations of errors obtained at step S1309, in the error-corrected BCH codeword. The flash memory system may output a restored BCH codeword, which is the BCH codeword restored from the error-corrected BCH codeword. The flash memory system may output the restored BCH codeword since the error-corrected BCH codeword, which is not correctly error-corrected, may have more errors than the original BCH codeword.

At step S1323, the flash memory system may transfer the restored BCH codeword and a failure flag to the host when the first syndrome values and the second syndrome values are not the same as each other.

FIGS. 14 to 21 are diagrams schematically illustrating a three-dimensional (3D) nonvolatile memory device in accordance with an embodiment of the present invention. FIGS. 14 to 21 illustrate the semiconductor memory device, for example a flash memory device implemented in 3D in accordance with an embodiment of the present invention.

Figure 14:
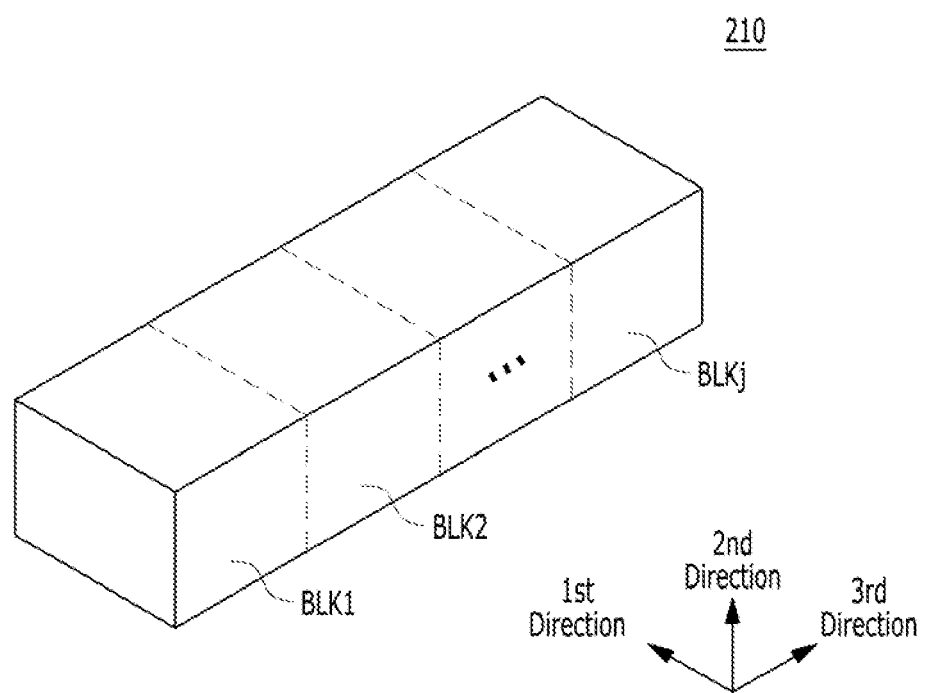
FIGS. 14 to 18 are diagrams schematically illustrating a three-dimensional (3D) nonvolatile memory device in accordance with an embodiment of the present invention.

FIG. 14 is a block diagram illustrating the memory cell array of the memory block 210 shown in FIG. 2. Referring to FIG. 14, the memory cell array may include a plurality of memory blocks BLK1 to BLKj. Each of the memory blocks BLK1 to BLKj may have a 3D structure or a vertical structure. For example, each of the memory blocks BLK1 to BLKj may include a structure extending along first to third directions, that is, including x-direction, y-direction and z-direction.

Each of the memory blocks BLK1 to BLKj may include a plurality of NAND strings NS extending along the second direction. The plurality of NAND strings NS may be provided along the first and third directions.

Each of the NAND strings NS may be coupled to a bit line BL, one or more string select lines SSL, one or more ground select lines GSL, a plurality of word lines WL, one or more dummy word lines DWL, and a common source line CSL. That is, each of the memory blocks BLK1 to BLKj may be coupled to a plurality of bit lines BL, a plurality of string select lines SSL, a plurality of ground select lines GSL, a plurality of word lines WL, a plurality of dummy word lines DWL, and a plurality of common source lines CSL.

Figure 15:
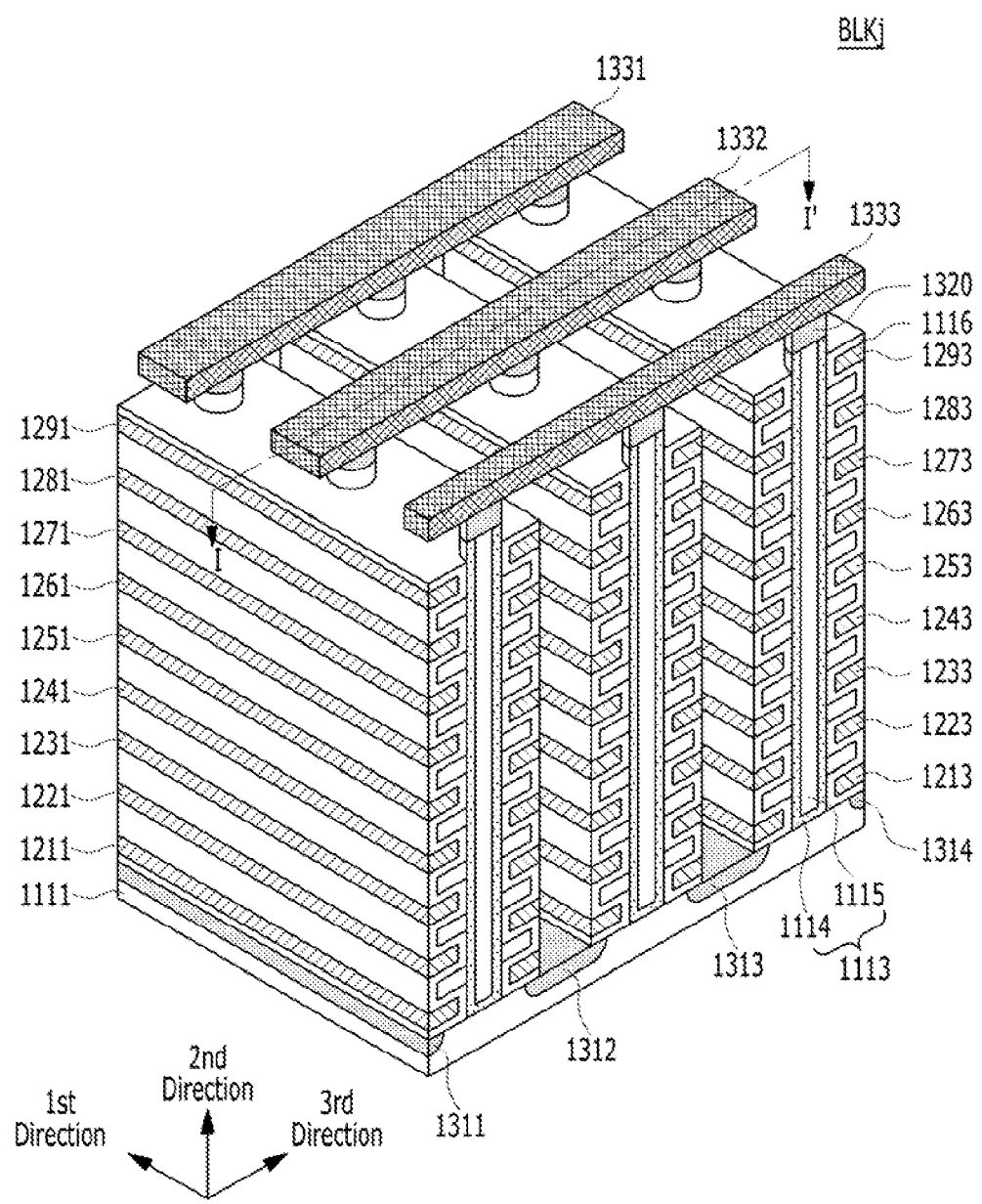
Figure 16:
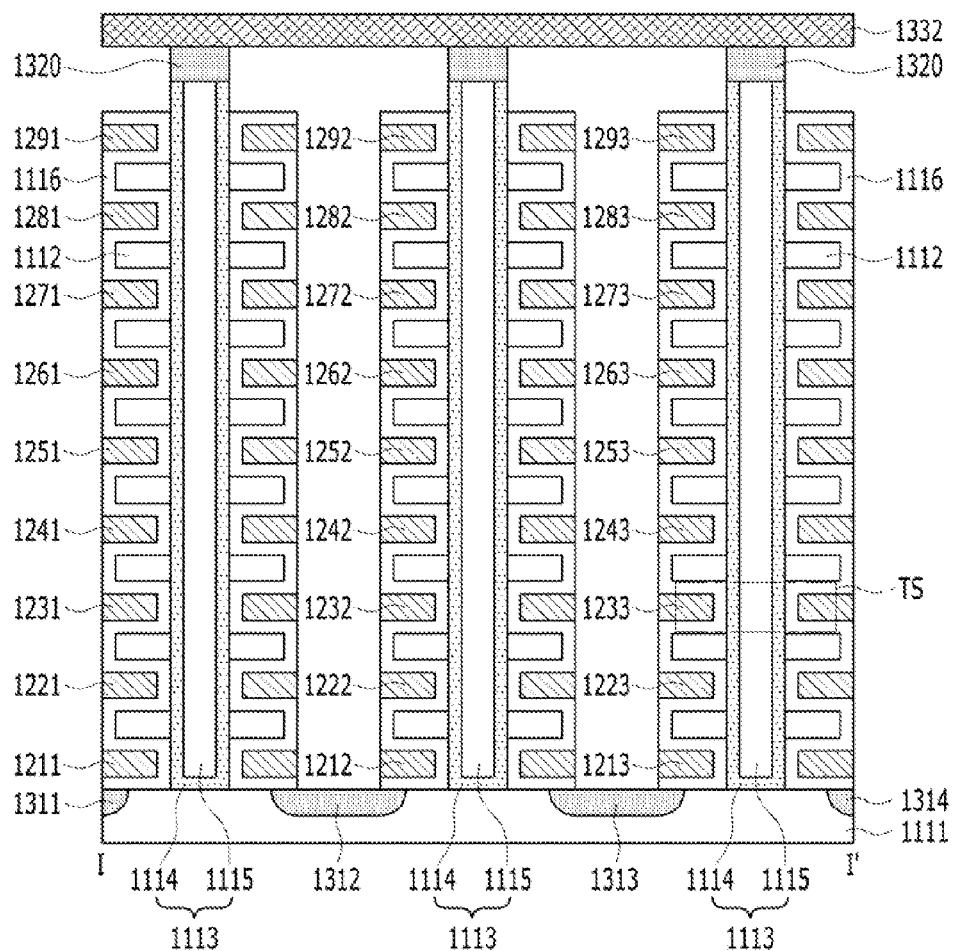

FIG. 15 is a perspective view of one memory block BLKj of the memory blocks BLK1 to BLKj shown in FIG. 14. FIG. 16 is a cross-sectional view taken along a line I-I' of the memory block BLKj shown in FIG. 15.

Referring to FIGS. 15 and 16, the memory block BLKj may include a structure extending along first to third directions.

A substrate 1111 may be provided. For example, the substrate 1111 may include a silicon material doped by a first type impurity. In another embodiment, the substrate 1111 may include a silicon material doped by a p-type impurity or a p-type well, for example, a pocket p-well. The substrate 1111 may further include an n-type well surrounding the p-type well. In the following embodiment, the substrate 1111 is p-type silicon. However, the substrate 1111 is not limited to p-type silicon.

A plurality of doping regions 1311 to 1314 extending along the first direction may be provided over the substrate 1111. For example, the plurality of doping regions 1311 to 1314 may have a second type impurity different from that of the substrate 1111. For example, the plurality of doping regions 1311 to 1314 may be doped with an n-type impurity. In the following embodiment, the first to fourth doping regions 1311 to 1314 are n-type. However, the first to fourth doping regions 1311 to 1314 are not limited to being n-type.

A plurality of insulation materials 1112 extending along the first direction may be sequentially provided along the second direction over the substrate 1111 between the first and second doping regions 1311 and 1312. For example, the insulation materials 1112 and the substrate 1111 may be spaced apart by a predetermined distance in the second direction. For example, the insulation materials 1112 may be spaced apart from each other in the second direction. For example, the insulation materials 1112 may include an insulator such as silicon oxide.

A plurality of pillars 1113 may be sequentially provided along the first direction over the substrate 111 between the first doping region 1311 and the second doping region 1312, and may be formed to penetrate the insulation materials 1112 along the second direction. For example, each of the plurality of pillars 1113 may penetrate the insulation materials 1112 to contact the substrate 1111. For example, each of the pillars 1113 may be composed of a plurality of materials. For example, a surface layer 1114 of each of the pillars 1113 may include a silicon material having a first type of impurity. For example, the surface layer 1114 of each of the pillars 1113 may include a silicon material doped with the same type impurity as that of the substrate 1111. In this embodiment, the surface layer 1114 of each pillar 1113 includes p-type silicon. However, the surface layer 1114 of each pillar 1113 is not limited to p-type silicon.

An inner layer 1115 of each of the pillars 1113 may be formed of an insulation material. For example, the inner layer 1115 of each of the pillars 1113 may be filled with an insulation material such as silicon oxide.

In a region between the first and second doping regions 1311 and 1312, an insulation layer 1116 may be provided along exposed surfaces of the insulation materials 1112, the pillars 1113, and the substrate 1111. For example, the thickness of the insulation layer 1116 may be smaller than half of the distance between the insulation materials 1112. That is, a region, in which a material other than the insulation materials 1112 and the insulation layer 1116 is disposed, may be provided between (i) the insulation layer 1116 provided over the bottom surface of a first insulation material of the insulation materials 1112 and (ii) the insulation layer 1116 provided over the top surface of a second insulation material of the insulation materials 1112. The insulation materials 1112 are provided below the first insulation material.

In the region between the first and second doping regions 1311 and 1312, conductive materials 1211 to 1291 may be provided over the surface of the insulation layer 1116. For example, the conductive material 1211 extending along the first direction may be provided between the substrate 1111 and the plural insulation materials 1112, adjacent to the substrate 1111. More specifically, the conductive material 1211 extending along the first direction may be provided between (i) the Insulation layer 1116 disposed over the substrate 1111 and (ii) the insulation layer 1116 disposed over the bottom surface of the insulation materials 1112, adjacent to the substrate 1111.

A conductive material extending along the first direction may be provided between (i) the insulation layer 1116 disposed over the top surface of a specific insulation material among the insulation materials 1112 and (ii) the insulation layer 1116 disposed over the bottom surface of another insulation material among the insulation materials 1112, which is disposed over the specific insulation material 1112. For example, a plurality of conductive materials 1221 to 1281, each extending along the first direction may be provided between the insulation materials 1112. Additionally, a conductive material 1291 extending along the first direction may be provided over the uppermost insulation materials 1112. For example, the conductive materials 1211 to 1291, each extending along the first direction may be a metallic material. For example, the conductive materials 1211 to 1291, each extending along the first direction may be a conductive material such as polysilicon.

The same structure as disposed between the first and second doping regions 1311 and 1312 may be provided between the second and third doping regions 1312 and 1313. For example, the plurality of insulation materials 1112 extending along the first direction, the plurality of pillars 1113 which are sequentially arranged in the first direction and penetrate the plurality of insulation materials 1112 along the second direction, the insulation layer 1116 provided over the surfaces of the plurality of insulation materials 1112 and the plurality of pillars 1113, and the plurality of conductive materials 1212 to 1292, extending along the first direction may be provided between the second and third doping regions 1312 and 1313.

The same structure that is disposed between the first and second doping regions 1311 and 1312 may be provided between the third and fourth doping regions 1313 and 1314. For example, the plurality of insulation materials 1112 extending along the first direction, the plurality of pillars 1113 that are sequentially arranged in the first direction and penetrate the plurality of insulation materials 1112 along the second direction, the insulation layer 1116 provided over the surfaces of the plurality of insulation materials 1112 and the plurality of pillars 1113, and the plurality of conductive materials 1213 to 1293 extending along the first direction may be provided between the third and fourth doping regions 1313 and 1314.

Drains 1320 may be provided over the plurality of pillars 1113, respectively. For example, the drains 1320 may be a silicon material doped with a second type material. For example, the drains 1320 may be a silicon material doped with an n-type material. In an embodiment, the drains 320 are a silicon material doped with an n-type material. However, the drains 320 will not be limited to n-type silicon materials. For example, the width of the drains 1320 may be wider than that of their corresponding one of the pillars 1113. For example, the drains 1320 may be provided over a top surface of a corresponding one of the pillars 1113 in a pad shape.

Conductive materials 1331 to 1333 extending in the third direction may be provided over the drains 1320. The conductive materials 1331 to 1333 may be sequentially disposed along the first direction. The conductive materials 1331 to 1333 may be respectively coupled to the drains 1320 in the corresponding region. For example, the drains 1320 and the conductive material 1333 extending along the third direction may be coupled to each other through contact plugs, respectively. For example, the conductive materials 1331 to 1333 extending along the third direction may be a metallic material. For example, each of the conductive materials 1331 to 1333 may be a conductive material such as polysilicon.

Referring to FIGS. 15 and 16, each of the pillars 1113 may be coupled to the insulation layer 1116 and the plurality of conductive materials 1211 to 1291, 1212 to 1292, and 1213 to 1293 extending along the first direction, to form a string. For example, each of the pillars 1113 may form a NAND string NS together with the insulation layer 1116 and the conductive materials 1211 to 1291, 1212 to 1292, and 1213 to 1293 extending along the first direction. The NAND string NS may include a plurality of transistor structures TS.

Figure 17:
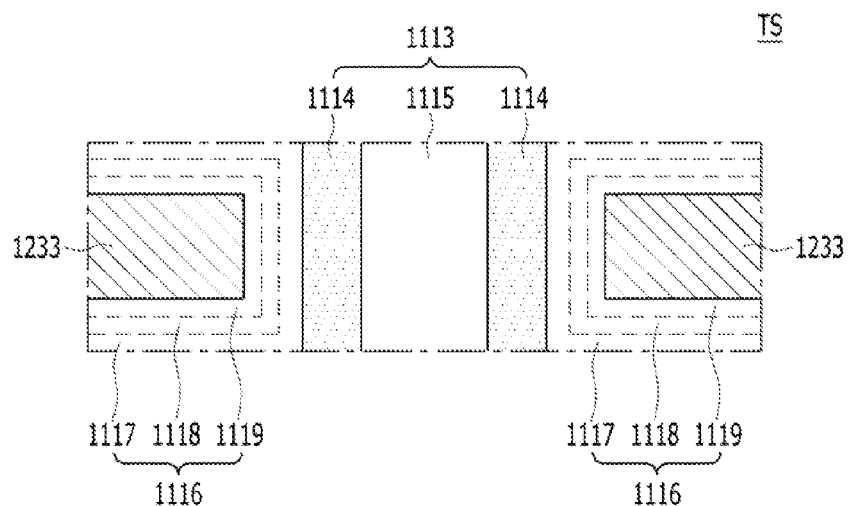

FIG. 17 is a cross-sectional view of the transistor structure TS shown in FIG. 16. Referring to FIGS. 15 to 17, the insulation layer 1116 may include first to third sub insulation layers 1117, 1118 and 1119.

The surface layer 1114 of P-type silicon in each of the pillars 1113 may serve as a body. The first sub insulation layer 1117, adjacent to each of the pillars 1113, may serve as a tunneling insulation layer. For example, the first sub insulation layer 1117, adjacent to the each of the pillars 1113, may include a thermal oxide layer.

The second sub insulation layer 1118 may serve as a charge storage layer. For example, the second sub insulation layer 1118 may serve as a charge trap layer. For example, the second sub insulation layer 1118 may include a nitride layer or a metal oxide layer, such as, aluminium oxide layer, hafnium oxide layer, etc.

The third sub insulation layer 1119 adjacent to a conductive material 1233 may serve as a blocking insulation layer. For example, the third sub insulation layer 1119 adjacent to the conductive material 1233 extending along the first direction may have a mono-layered or multi-layered structure. The third sub insulation layer 1119 may be a high dielectric layer, such as, aluminium oxide layer, hafnium oxide layer, etc., having a dielectric constant greater than the first and second sub insulation layers 1117 and 1118.

The conductive material 1233 may serve as a gate or control gate. That is, the gate or control gate 1233, the blocking insulation layer 1119, the charge trap layer 1118, the tunneling insulation layer 1117, and the body 1114 may form a transistor or memory cell transistor structure. For example, the first to third sub insulation layers 1117 to 1119 may form an oxide-nitride-oxide (ONO) structure. In the embodiment, the surface layer 1114 of p-type silicon in each of the pillars 1113 may be referred to as a body in the second direction.

The memory block BLKj may include pillars 1113. That is, the memory block BLKj may include NAND strings NS. More specifically, the memory block BLKj may include NAND strings NS extending along the second direction or a direction perpendicular to the substrate 1111.

Each of the NAND strings NS may include transistor structures TS which are stacked in the second direction. One or more of the plurality of transistor structures TS of each NAND string NS may serve as a string select transistor SST. One or more of the plurality of transistor structures TS of each NAND string may serve as a ground select transistor GST.

The gates or control gates may correspond to the conductive materials 1211 to 1291, 1212 to 1292, and 1213 to 1293 extending along the first direction. That is, the gates or control gates may extend along the first direction to form word lines WL and two or more select lines, such as, one or more string select line SSL and one or more ground select line GSL.

The conductive materials 1331 to 1333 extending along the third direction may be coupled to one end of the NAND strings NS. For example, the conductive materials 1331 to 1333 extending along the third direction may serve as bit lines BL. That is, in one memory block BLKj, a single bit line BL may be coupled to the plurality of NAND strings.

The second type doping regions 1311 to 1314 extending along the first direction may be coupled to the other end of the NAND strings NS. The second type doping regions 1311 to 1314 extending along the first direction may serve as common source lines CSL.

In summary, the memory block BLKj may include the plurality of NAND strings NS extending along a direction, for example, a second direction, perpendicular to the substrate 1111, and may operate as a NAND flash memory block, for example, a charge trap type memory, in which the plurality of NAND strings NS is coupled to a single bit line BL.

Figure 18:
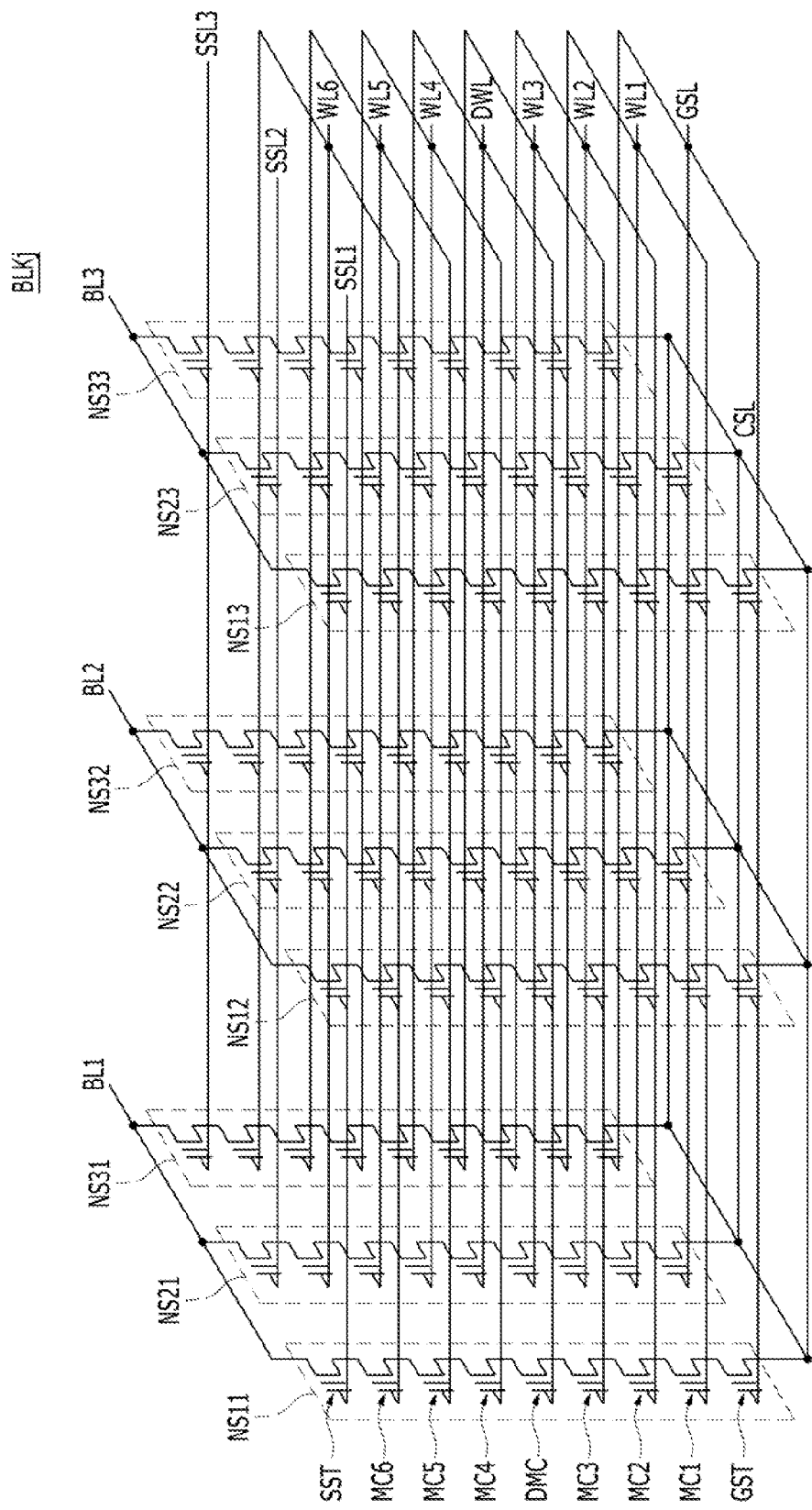
Figure 19:
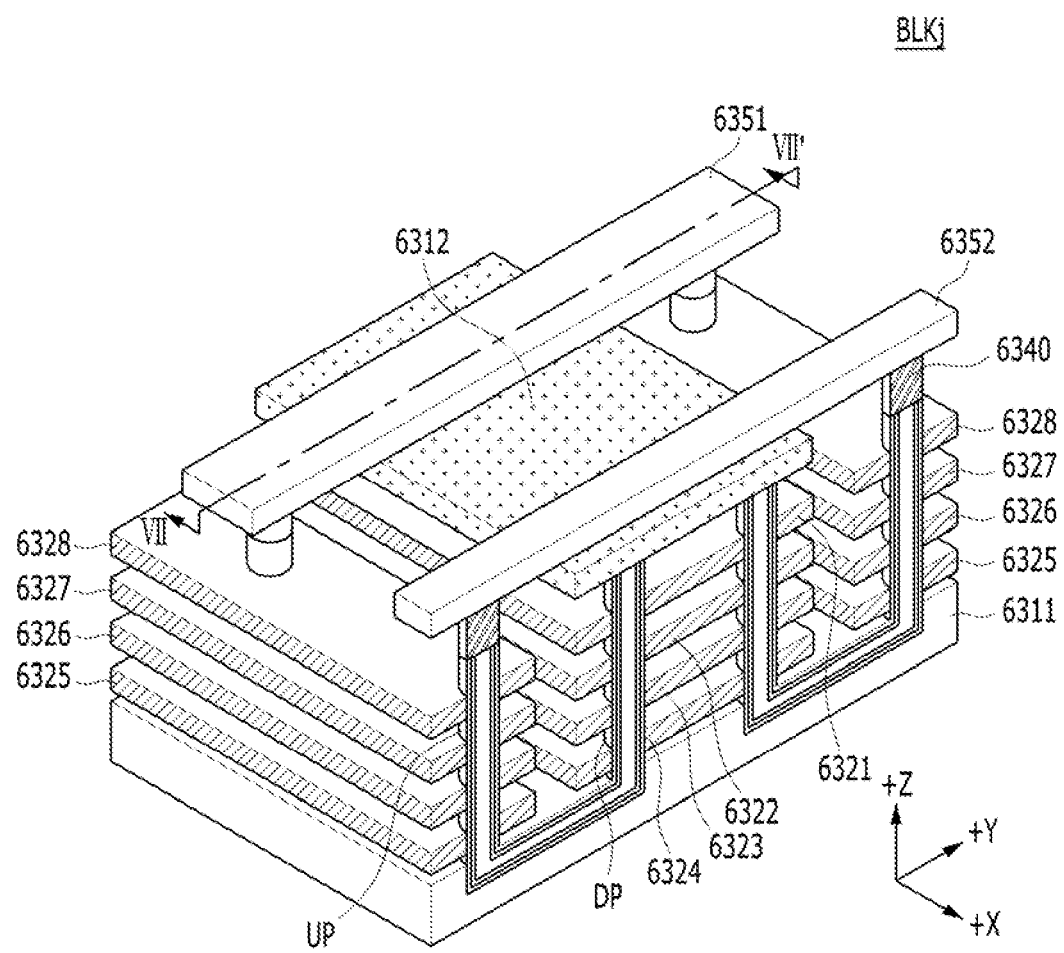
FIGS. 19 to 21 are diagrams schematically illustrating a 3D nonvolatile memory device in accordance with an embodiment of the present invention.
Figure 20:
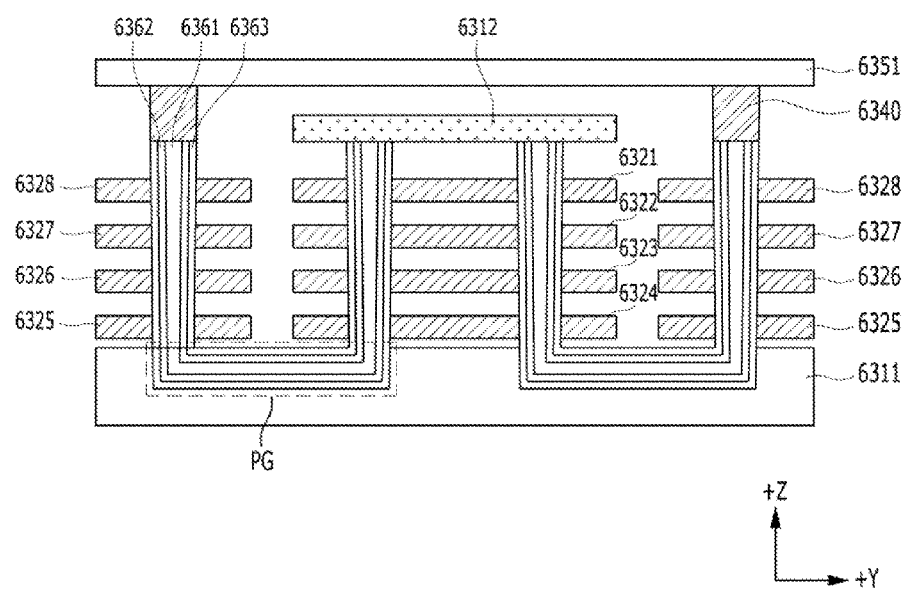

With reference to FIGS. 18 to 20, the conductive materials 1211 to 1291, 1212 to 1292, and 1213 to 1293 extending along the first direction are provided on 9 layers. However, the number of first conductive materials 1211 to 1291, 1212 to 1292, and 1213 to 1293 extending along the first direction is not limited to 9 layers. For example, the conductive materials extending along the first direction may have 8, 16 or more layers. That is, a NAND string may include 8, 16 or more transistors.

In FIGS. 15 to 17, 3 NAND strings NS are coupled to a single bit line BL. However, the number of NAND strings NS coupled to a single bit line BL is not limited to 3. In another embodiment, in the memory block BLKj, m NAND strings NS may be coupled to a single bit line BL, m being an integer. Here, the number of the conductive materials 1211 to 1291, 1212 to 1292, and 1213 to 1293 extending along the first direction and the number of common source lines 1311 to 1314 may also be adjusted in response to the number of NAND strings NS coupled to a single bit line BL.

With reference to FIGS. 15 to 17, three NAND strings NS are coupled to a single conductive material extending along the first direction. However, the number of NAND strings NS which is coupled to a single conductive material is not limited to three. In another embodiment, n NAND strings NS may be coupled to a single conductive material, n being an integer. Here, the number of the conductive materials 1331 to 1333 extending along the third direction may also be adjusted in response to the number of NAND strings NS coupled to a single conductive material.

FIG. 18 is an equivalent circuit diagram illustrating the memory block BLKj described in FIGS. 15 to 17.

Referring to FIGS. 15 to 18, NAND strings NS11 to NS31 may be provided between a first bit line BL1 and a common source line CSL. The first bit line BL1 may correspond to the conductive material 1331 extending along the third direction. NAND strings NS12 to NS32 may be provided between a second bit line BL2 and the common source line CSL. The second bit line BL2 may correspond to the conductive material 1332 extending along the third direction. NAND strings NS13 to NS33 may be provided between a third bit line BL3 and the common source line CSL. The third bit line BL3 may correspond to the conductive material 1333 extending along the third direction.

A string select transistor SST of each NAND string NS may be coupled to a corresponding bit line BL. A ground select transistor GST of each NAND string NS may be coupled to the common source line CSL. Memory cells MC may be provided between the string select transistor SST and the ground select transistor GST of each NAND string NS.

The NAND strings NS may be defined in units of rows and columns. The NAND strings NS commonly coupled to a single bit line may form a single column. For example, the NAND strings NS11 to NS31 coupled to the first bit line BL1 may correspond to a first column. The NAND strings NS12 to NS32 coupled to the second bit line BL2 may correspond to a second column. The NAND strings NS13 to NS33 coupled to the third bit line BL3 may correspond to a third column.

The NAND strings NS coupled to a single string select line SSL may form a single row. For example, the NAND strings NS11 to NS13 coupled to a first string select line SSL1 may form a first row. The NAND strings NS21 to NS23 coupled to a second string select line SSL2 may form a second row. The NAND strings NS31 to NS33 coupled to a third string select line SSL3 may form a third row.

A height may be defined for each NAND string NS. For example, a height or an elevation or a level of the ground select transistor GST may be defined as a value '1' in each NAND string NS. In each NAND string NS, the closer to the string selection transistor SST, the higher the height of the memory cell, when measured from the substrate 1111. In each NAND string NS, the height of the memory cell MC6 adjacent to the string select transistor SST may be defined as a value '6', which is 6 times higher than the ground select transistor GST.

The string select transistors SST of the NAND strings NS of the same row may share the same string select line SSL. The string select transistors SST of the NAND strings NS in different rows may be coupled with different string select lines SSL1, SSL2, and SSL3, respectively.

The memory cells MC having the same height in the NAND strings NS of the same row may share a word line WL. At a predetermined height, the word line WL may be shared by the memory cells MC of the NAND strings NS in different rows and at the same level or the same height. At a predetermined height or at the same level, dummy memory cells DMC of the NAND strings NS of the same row may share a dummy word line DWL. At a predetermined height or level, the dummy memory cells DMC of the NAND strings NS in different rows may share the dummy word lines DWL.

For example, the word lines WL or the dummy word lines DWL located at the same level or height or elevation may be commonly coupled to each other. For example, each of the conductive materials 1211 to 1291, 1212 to 1292, and 1213 to 1293 provided at a given level or height or elevation may be coupled to an upper layer via a contact. The conductive materials 1211 to 1291, 1212 to 1292, and 1213 to 1293 extending in the first direction may be coupled to each other at the upper layer. The ground select transistors GST of the NAND strings NS of the same row may share the ground select line GSL. The ground select transistors GST of the NAND strings NS in different rows may share the ground select line GSL. That is, the NAND strings NS11 to NS13, NS21 to NS23, and NS31 to NS33 may be coupled in common to the ground select line GSL.

The common source line CSL may be commonly coupled to the NAND strings NS. For example, the first to fourth doping regions 1311 to 1314 may be coupled at an active region of the substrate 1111. For example, the first to fourth doping regions 1311 to 1314 may be coupled to an upper layer, which serves as common source line CSL, via a contact. The first to fourth doping regions 1311 to 1314 may be coupled in common at the upper layer.

As illustrated in FIG. 18, the word lines WL at the same height or level may be commonly coupled to each other. Therefore, when the word line WL at a specific height is selected, all of the NAND strings NS coupled to the selected word line WL may be selected. The NAND strings NS in different rows may be coupled to different string select lines SSL. Accordingly, among the NAND strings NS coupled to the same word line WL, the NAND strings NS of the unselected row may be electrically isolated from the bit lines BL1 to BL3 in response to a selection of the string selection lines SSL1 to SSL3. That is, a row of the NAND strings NS may be selected by selecting one of the string select lines SSL1 to SSL3. The NAND strings NS of the selected row may be selected in units of columns in response to a selection of the bit lines BL1 to BL3.

In each NAND string NS, a dummy memory cell DMC may be provided. In FIG. 18, the dummy memory cell DMC is provided between the third memory cell MC3 and the fourth memory cell MC4 in each NAND string NS. That is, the first to third memory cells MC1 to MC3 may be provided between the dummy memory cell DMC and the ground select transistor GST. The fourth to sixth memory cells MC4 to MC6 may be provided between the dummy memory cell DMC and the string select transistor SST. In this embodiment, the memory cells MC in each NAND string NS are divided into memory cell groups by the dummy memory cell DMC. A memory cell group, such as, MC1 to MC3, adjacent to the ground select transistor GST among the memory cell groups may be referred to as a lower memory cell group. A memory cell group, such as, MC4 to MC6, adjacent to the string select transistor SST among the memory cell groups may be referred to as an upper memory cell group.

An operating method of a semiconductor memory system which includes one or more cell strings arranged in a direction perpendicular to a substrate coupled with a memory controller and including memory cells, a string select transistor and a ground select transistor, will be described with reference to FIGS. 14 to 18. In the operating method, the semiconductor memory system may be provided with a first read command to perform first and second hard decision read operations in response to a first hard decision read voltage and a second hard decision read voltage that is different from the first hard decision read voltage, may acquire hard decision data, may select one of the first and second hard decision voltages based on an error bit state of the hard decision data, may acquire soft decision data in response to a soft read voltage that is different from the first and second hard decision read voltages, and provide the soft decision data to a memory controller.

Figure 21:
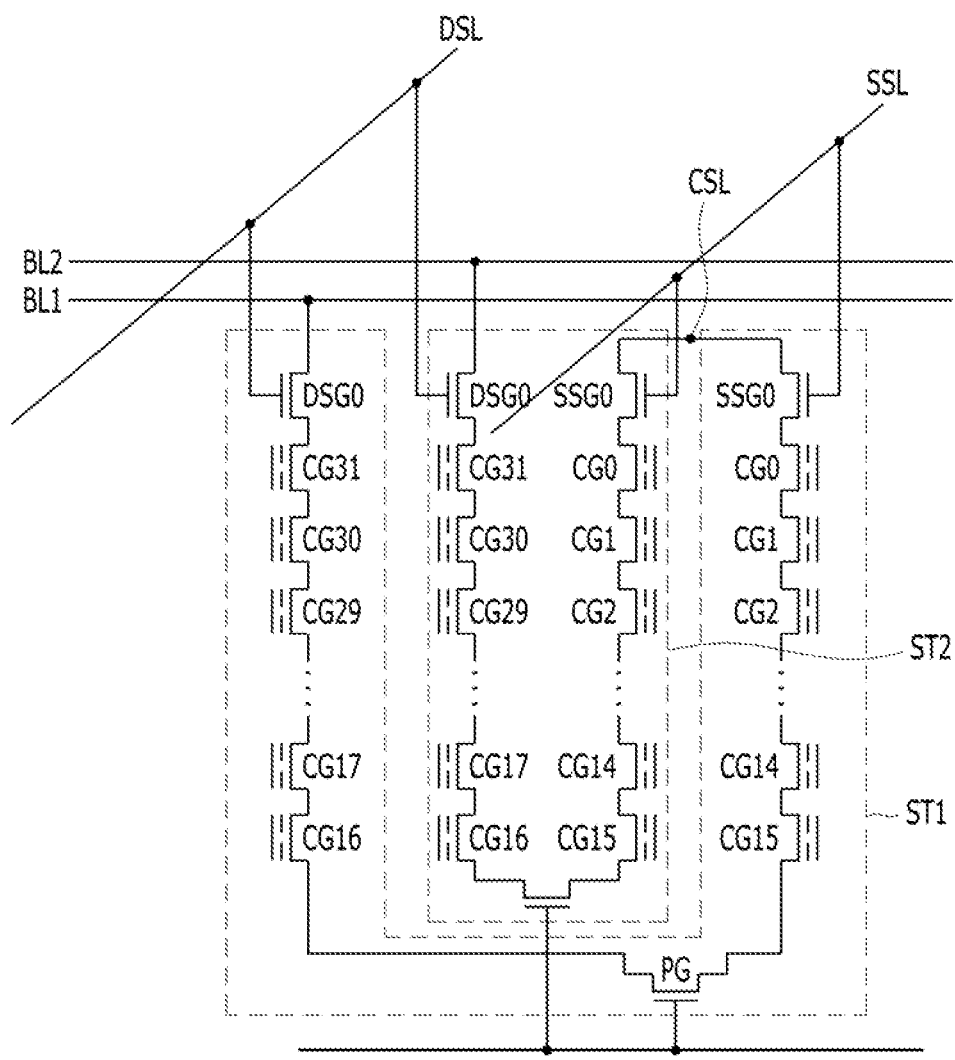

FIGS. 19 to 21 are diagrams schematically illustrating a 3D nonvolatile memory device in accordance with an embodiment of the present invention. FIGS. 19 to 21 illustrate the semiconductor memory system, for example, a flash memory device implemented in 3D in accordance with an embodiment of the present invention.

FIG. 19 is a perspective view illustrating one memory block BLKj of the memory blocks 210 shown in FIG. 14. FIG. 20 is a sectional view taken along the line VII-VII' shown in FIG. 19. Referring to FIGS. 19 and 20, the memory block BLKj may include a structure extending along first to third directions.

A substrate 6311 may be provided. For example, the substrate 6311 may include a silicon material doped by a first type impurity. For example, the substrate 6311 may include a silicon material doped by a p-type impurity or a p-type well, such as, a pocket p-well. The substrate 6311 may further include an n-type well surrounding the p-type well. In the following embodiment, the substrate 6311 is p-type silicon. However, the substrate 6311 will not be limited to p-type silicon.

First to fourth conductive material layers 6321 to 6324 extending along the X-direction and the Y-direction may be disposed over the substrate 6311. The first to fourth conductive material layers 6321 to 6324 may be spaced apart from one another in the Z-direction.

Fifth to eighth conductive material layers 6325 to 6328 extending along the X-direction and the Y-direction may be disposed over the substrate 6311. The fifth to eighth conductive material layers 6325 to 6328 may be spaced apart from one another in the Z-direction. The fifth to eighth conductive material layers 6325 to 6328 may be spaced apart from the first to fourth conductive material layers 6321 to 6324 in the Y-direction.

A plurality of lower pillars DP may be formed to penetrate the first to fourth conductive material layers 6321 to 6324. Each of the lower pillars DP may be extended in the Z-direction. A plurality of upper pillars UP may be formed to penetrate the fifth to eighth conductive material layers 6325 to 6328. Each of the upper pillars UP may be extended in the Z-direction.

Each of the lower pillars DP and the upper pillars UP may include an internal material layer 6361, a middle layer 6362 and a surface layer 6363. The middle layer 6362 may serve as a channel of the cell transistor. The surface layer 6363 may include a blocking insulating layer, an electric charge storage layer and a tunnel insulating layer.

The lower pillars DP and the upper pillars UP may be coupled through a pipe gate PG. The pipe gate PG may be formed in the substrate 6311. For example, the pipe gate PG may include substantially the same material as the plural lower pillars DP and the plural upper pillars UP.

A doping material layer 6312 with a second impurity type may be disposed on the plural lower pillars DP. The doping material layer 6312 may extend in the X direction and the Y direction. For example, the doping material layer 6312 with the second impurity type may include n-type silicon material. The doping material layer 6312 with the second Impurity type may serve as the common source line CSL.

Drains 6340 may be formed on each of the plural upper pillars UP. For example, the drain 6340 may include n-type silicon material. First and second upper conductive material layers 6351 and 6352 may be formed on the drains 6340.

The first and second upper conductive material layers 6351 and 6352 may be extended in the Y-direction.

The first and second upper conductive material layers 6351 and 6352 may be spaced apart from each other in the X-direction. For example, the first and second upper conductive material layers 6351 and 6352 may be formed of metal. For example, the first and second upper conductive material layers 6351 and 6352 may be coupled to drains 6340 through contact plugs. The first and second upper conductive material layers 6351 and 6352 may serve as first and second bit lines BL1 and BL2, respectively.

The first conductive material layer 6321 may serve as the source select line SSL. The second conductive material layer 6322 may serve as the first dummy word line DWL1. The 3rd and 4th conductive material layers 6323 and 6324 may serve as the first and second main word lines MWL1 and MWL2, respectively. The 5th and 6th conductive material layers 6325 and 6326 may serve respectively as the 3rd and 4th main word lines MWL3 and MWL4, the 7th conductive material layer 6327 may serve as the second dummy word line DWL2, and the 8th conductive material layer 6328 may serve as the drain select line DSL.

Each of the plural lower pillars DP and the first to 4th conductive material layers 6321 to 6324 adjacent to the lower pillar DP may form a lower string. Each of the plural upper pillars UP and the 5th to 8th conductive material layers 6325 to 6328 adjacent to the upper pillar UP may form an upper string. The lower string and the upper string may be coupled through the pipe gate PG. One end of the lower string may be coupled to the second-type doping material layer 6312 serving as the common source line CSL. One end of the upper string may be coupled to a corresponding bit line through the drain 6320. The lower string and the upper string are coupled through the pipe gate PG. A single lower string and a single upper string may form a single cell string coupled between the second-type doping material layer 6312 and corresponding bit line.

That is, the lower string may include the source select transistor SST, the first dummy memory cell DMC1, and the first and second main memory cells MMC1 and MMC2. The upper string may include the 3rd and 4th main memory cells MMC3 and MMC4, the second dummy memory cell DMC2 and the drain select transistor DST.

Referring to FIGS. 19 and 20, the upper string and the lower string may form the NAND string NS having a plurality of transistor structures TS. The structure of the transistor TS may be the same as described with reference to FIG. 17.

FIG. 21 is an equivalent circuit diagram illustrating the memory block BLKj described with reference to FIGS. 19 and 20. FIG. 21 exemplarily shows first and second strings among the strings included in the memory block BLKj.

Referring to FIG. 21, the memory block BLKj may include a plurality of cell strings, each of which comprises a single upper string and a single lower string coupled to each other through the pipe gate PG, as described with reference to FIGS. 19 and 20.

In the memory block BLKj, memory cells stacked along a first channel layer CH1, one or more source selection gates, and one or more drain selection gates may form a first string ST1. Memory cells stacked along a second channel layer CH2, one or more source selection gates, and one or more drain selection gates may form a second string ST2.

The first and second strings ST1 and ST2 may be coupled to a single drain selection line DSL and a single source selection line SSL. The first string ST1 may be coupled to a first bit line BL1, and the second string ST2 may be coupled to a second bit line BL2.

FIG. 21 shows the first and second strings ST1 and ST2 coupled to a single drain selection line DSL and a single source selection line SSL. The first and second strings ST1 and ST2 may be coupled to a single source selection line SSL and a single bit line BL. In such case, the first string ST1 may be coupled to the first drain selection line DSL1, and the second string ST2 may be coupled to the second drain selection line DSL2. In another embodiment, the first and second strings ST1 and ST2 may be coupled to a single drain selection line DSL and a single bit line BL. In such case, the first string ST1 may be coupled to the first source selection line SSL1, and the second string ST2 may be coupled to the second source selection line SSL2.

Figure 22:
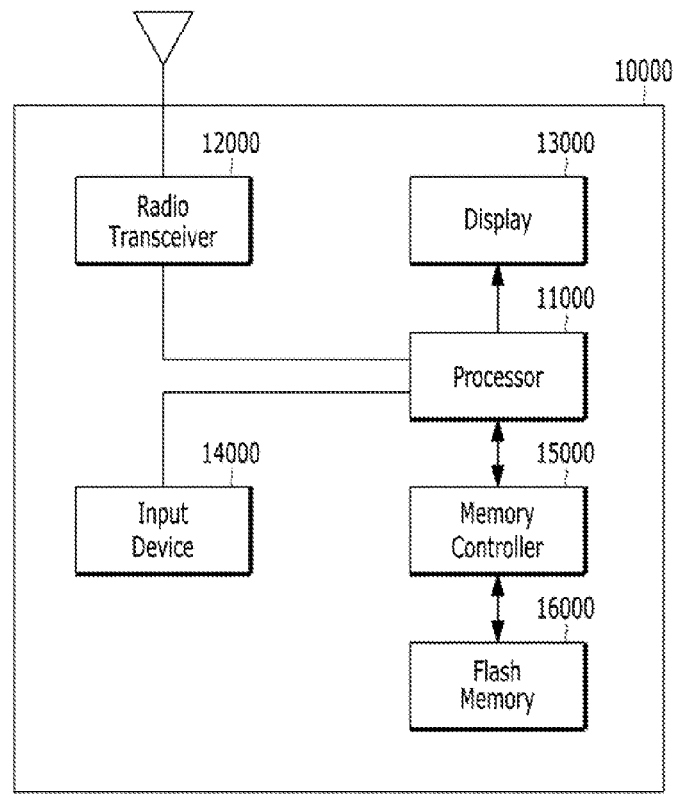
FIG. 22 is a block diagram schematically illustrating an electronic device including a semiconductor memory system in accordance with an embodiment of the present invention.

FIG. 22 is a block diagram schematically illustrating an electronic device 10000 including a memory controller 15000 and a flash memory 16000 in accordance with an embodiment of the present invention.

Referring to FIG. 22, the electronic device 10000, which includes but is not limited to a cellular phone, a smart phone, or a tablet PC, may include the flash memory 16000 implemented by a flash memory device and the memory controller 15000 for controlling the flash memory 16000. The flash memory 16000 may correspond to the semiconductor memory system 110 described above with reference to FIGS. 3 to 13. The flash memory 16000 may store random data. The memory controller 15000 may be controlled by a processor 11000 which controls overall operations of the electronic device 10000.

Data stored in the flash memory 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the radio signal received from the antenna ANT into a signal which will be processed by the processor 11000. Thus, the processor 11000 may process the signal converted by the radio transceiver 12000, and may store the processed signal at the flash memory 16000. Otherwise, the processor 11000 may display the processed signal through the display 13000.

The radio transceiver 12000 may convert a signal from the processor 11000 into a radio signal, and may output the converted radio signal externally through the antenna ANT.

An input device 14000 may receive a control signal for controlling an operation of the processor 11000 or data to be processed by the processor 11000, and may be implemented by a pointing device such as a touch pad, a computer mouse, a key pad, and a keyboard.

The processor 11000 may control the display 13000 such that data from the flash memory 16000, the radio signal from the radio transceiver 12000, or the data from the input device 14000 is displayed through the display 13000.

Figure 23:
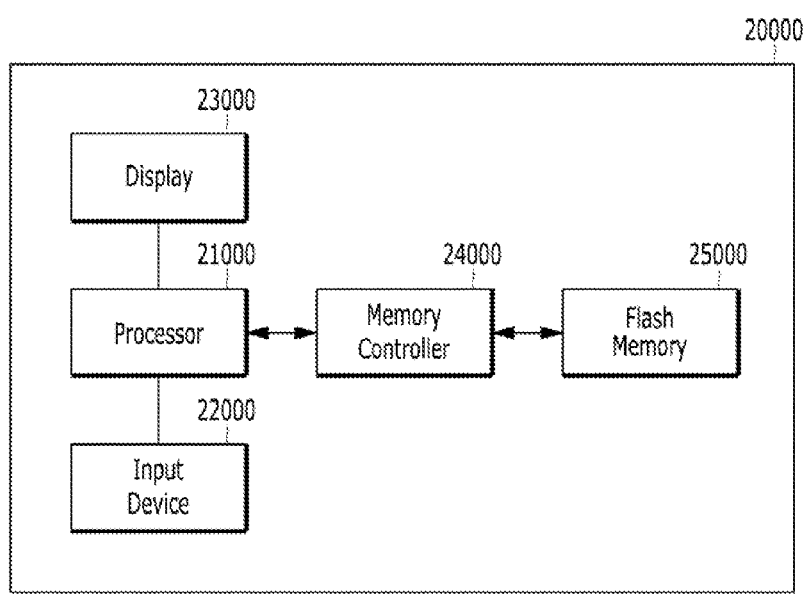
FIG. 23 is a block diagram schematically illustrating an electronic device including a semiconductor memory system in accordance with an embodiment of the present invention.

FIG. 23 is a block diagram schematically illustrating an electronic device 20000 including a memory controller 24000 and a flash memory 25000 in accordance with an embodiment of the present invention.

Referring to FIG. 23, the electronic device 20000 may be implemented by a data processing device such as a personal computer (PC), a tablet computer, a net-book, an e-reader, a personal digital assistant (PDA), a portable multimedia player (PMP), an MP3 player, and an MP4 player, and may include the flash memory 25000, for example, the flash memory device, and the memory controller 24000 to control an operation of the flash memory 25000.

The electronic device 20000 may include a processor 21000 to control overall operations of the electronic device 20000. The memory controller 24000 may be controlled by the processor 21000.

The processor 21000 may display data stored in the semiconductor memory system through a display 23000 in response to an input signal from an input device 22000. For example, the input device 22000 may be implemented by a pointing device such as a touch pad, a computer mouse, a key pad, and a keyboard.

Figure 24:
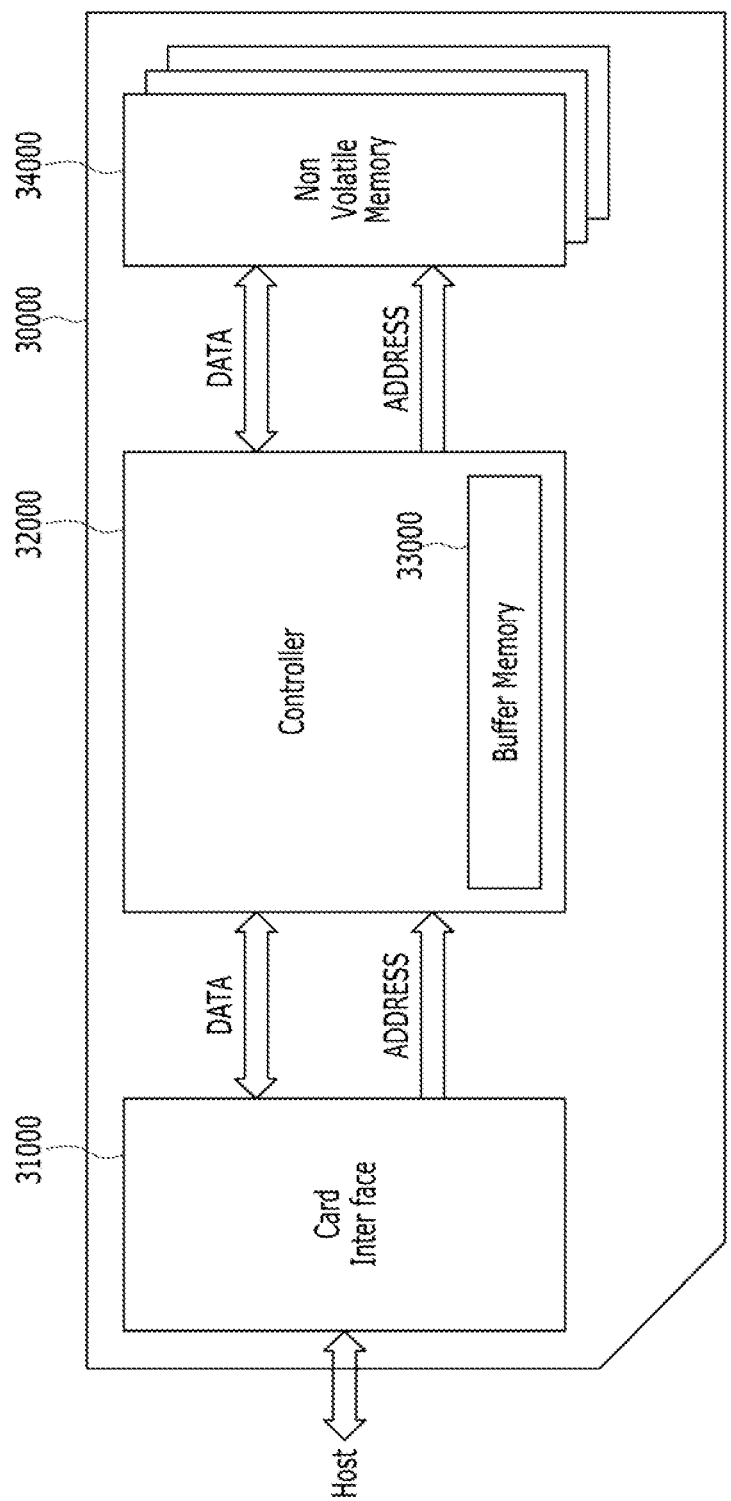
FIG. 24 is a block diagram schematically illustrating an electronic device including a semiconductor memory system in accordance with an embodiment of the present invention.

FIG. 24 is a block diagram schematically illustrating an electronic device 30000 including a controller 32000 and a semiconductor memory system 34000 in accordance with an embodiment of the present invention.

Referring to FIG. 24, the electronic device 30000 may include a card interface 31000, the controller 32000, and the semiconductor memory system 34000, for example, a flash memory device.

The electronic device 30000 may exchange data with a host through the card interface 31000. The card interface 31000 may be a secure digital (SD) card interface or a multi-media card (MMC) interface, which does not limit the scope of the present invention. The card interface 31000 may interface the host and the controller 32000 according to a communication protocol of the host that is capable of communicating with the electronic device 30000.

The controller 32000 may control overall operations of the electronic device 30000, and may control data exchange between the card interface 31000 and the semiconductor memory system 34000. A buffer memory 33000 of the controller 32000 may buffer data transferred between the card interface 31000 and the semiconductor memory system 34000.

The controller 32000 may be coupled with the card interface 31000 and the semiconductor memory system 34000 through a data bus DATA and an address bus ADDRESS. In accordance with an embodiment, the controller 32000 may receive an address of data, which is to be read or written, from the card interface 31000 through the address bus ADDRESS, and may send it to the semiconductor memory system 34000. Further, the controller 32000 may receive or transfer data to be read or written through the data bus DATA connected with the card interface 31000 or the semiconductor memory system 34000.

When the electronic device 30000 is connected with the host such as a PC, a tablet PC, a digital camera, a digital audio player, a mobile phone, console video game hardware, and a digital set-top box, the host may exchange data with the semiconductor memory system 34000 through the card interface 31000 and the controller 32000.

While the present invention has been described with respect to the specific embodiments, it will be apparent to those skilled in the art that various changes and modifications may be made without departing from the spirit and scope of the invention as defined in the following claims.

What is claimed is:

1. An operation method of a flash memory system including a controller, a memory device, and a host, the operation method comprising:
   obtaining first syndrome values by performing a first syndrome operation to a codeword provided from the memory device;
   obtaining locations of errors and the number of the locations of errors, which are included in codeword, based on the first syndrome values;

error-correcting the codeword by flipping bit values of error bits of the codeword based on the locations of errors to generate an error-corrected codeword;
obtaining second syndrome values by performing a second syndrome operation to the error-corrected codeword;
determining whether an error is found in the error-corrected codeword based on the second syndrome values;
changing the first syndrome values when it is determined that no error is found in the error-corrected codeword and providing the error-corrected codeword and a success flag to the host; and
restoring the error-corrected codeword to the codeword by re-flipping the flipped bit values when it is determined that an error is found in the error-corrected codeword and providing the restored codeword to the host.

2. The operation method of claim 1, further comprising:
storing the first syndrome values to a first syndrome buffer; and
storing the second syndrome values to a second syndrome buffer.

3. The operation method of claim 1, wherein the obtaining of the locations of errors and the number of the locations of errors comprises:
generating an error location polynomial based on the first syndrome values; and
obtaining the locations of errors and the number of the locations of errors based on the error location polynomial.

4. The operation method of claim 3,
wherein the error location polynomial is generated using the Berleykamp-Massey algorithm or the Euclidian algorithm, and
wherein the locations of errors and the number of the locations of errors are obtained on the basis of the error location polynomial using the Chien search algorithm.

5. The operation method of claim 1, wherein the changing of the first syndrome values is performed by changing a value of '1' in the first syndrome values to a value '0', or by replacing the first syndrome values with the second syndrome values.

6. An operation method of a flash memory system including a controller, a memory device, and a host, the operation method comprising:
obtaining first syndrome values by performing a first syndrome operation to a codeword provided from the memory device;
obtaining locations of errors and a number of the locations of errors, which are included in the codeword, based on the first syndrome values;
error-correcting the codeword by flipping bit values of error bits of the codeword through error-correction bit values based on the locations of errors to generate an error-corrected codeword;
obtaining second syndrome values by performing a second syndrome operation to the error-correction bit values;
determining whether an error is found in the error-correction bit values by comparing the first syndrome values and the second syndrome values;
providing the error-corrected codeword and a success flag to the host when it is determined that the first syndrome value and the second syndrome values are the same as each other; and
restoring the error-corrected codeword to the codeword by re-flipping the flipped bit values of the error-corrected codeword when the first syndrome value and the second syndrome values are not the same as each other and providing the restored codeword and a failure flag to the host.

7. The operation method of claim 6, further comprising:
storing the first syndrome values to a first syndrome buffer; and
storing the second syndrome values to a second syndrome buffer.

8. The operation method of claim 6, wherein the obtaining of the locations of errors and the number of the locations of errors comprises:
generating an error location polynomial based on the first syndrome values; and
obtaining the locations of errors and the number of the locations of errors based on the error location polynomial.

9. The operation method of claim 8,
wherein the error location polynomial is generated using the Berleykamp-Massey algorithm or the Euclidian algorithm, and
wherein the locations of errors and the number of the locations of errors are obtained on the basis of the error location polynomial using the Chien search algorithm.

10. The operation method of claim 6, further comprising:
changing a value of '1' in the first syndrome values to a value of '0' or replacing the first syndrome values with the second syndrome values when it is determined that the first syndrome value and the second syndrome values are the same as each other.

11. A flash memory system including:
a memory device; and
a controller suitable for controlling a transfer of a codeword between the memory device and a host,
wherein the controller comprises an error correction decoder suitable for performing an ECC operation on the codeword,
wherein the codeword is provided from the memory device, and
wherein the error correction decoder comprises:
a first syndrome calculation block suitable for calculating a first syndrome values from the codeword;
a key-equation solver block suitable for generating an error location polynomial based on the first syndrome values;
a chien search block suitable for obtaining locations of errors and a number of the locations of errors based on the error location polynomial;
a first error correction block suitable for error-correcting the codeword by flipping bit values of the error bits of the codeword based on the locations of errors to generate an error-corrected codeword;
a second syndrome calculation block suitable for determining whether an error is found in the error-corrected codeword by calculating a second syndrome values from the error-corrected codeword;
a second error correction block suitable for restoring the error-corrected codeword to the codeword by re-flipping the flipped bit values of the error-corrected codeword to generate an restored codeword when it is determined that an error is found in the error-corrected codeword;
a setting block suitable for changing the first syndrome values when it is determined that no error is found in the error-corrected codeword includes one or more errors; and an output block suitable for providing the error-corrected codeword or the restored codeword according to the second syndrome values of the second syndrome calculation block.

12. The flash memory system of claim 11, wherein the flash memory system stores the first syndrome values to a first syndrome buffer, and stores the second syndrome values to a second syndrome buffer.

13. The flash memory system of claim 11, wherein the setting block changes a value of '1' in the first syndrome values to a value of '0' or replacing the first syndrome values with the second syndrome values.

14. The flash memory system of claim 11,
wherein the error location polynomial is generated using the Berleykamp-Massey algorithm or the Euclidian algorithm, and
wherein the locations of errors and the number of the locations of errors are obtained on the basis of the error location polynomial using the Chien search algorithm.

15. The flash memory system of claim 11,
wherein the output block provides the error-corrected codeword and a success flag to the host when it is determined that the error-corrected codeword includes no error, and
wherein the output block provides the restored codeword and a failure flag to the host when it is determined that the error-corrected codeword includes one or more errors.

16. The flash memory system of claim 11, further comprising:
a comparison block suitable for comparing a degree of the error location polynomial with the number of the locations of errors.

17. The flash memory system of claim 16, wherein the first error correction block error-corrects the codeword by flipping the bit values of the error bits of the codeword based on the locations of errors when the degree of the error location polynomial and the number of the locations of errors are the same as each other.

18. The flash memory system of claim 16, wherein the output block provides the codeword and a failure flag to the host when the degree of the error location polynomial and the number of the locations of errors are not the same as each other.

19. The flash memory system of claim 11, wherein the second syndrome calculation block provides the error-corrected codeword to the output block when the error-corrected codeword includes no error.

20. The flash memory system of claim 11, further comprising:
a third syndrome calculation block suitable for calculating a third syndrome values from the restored codeword.

21. The flash memory system of claim 20, wherein the flash memory system stores the first syndrome values in a syndrome buffer, stores the second syndrome values in the syndrome buffer by overwriting the first syndrome values, and stores the third syndrome values in the syndrome buffer by overwriting the second syndrome values.

* * * * *